US008865025B2

(12) United States Patent
Seshadri et al.

(10) Patent No.: US 8,865,025 B2
(45) Date of Patent: Oct. 21, 2014

(54) DOPED CONJUGATED POLYMERS, DEVICES, AND METHODS OF MAKING DEVICES

(75) Inventors: Venkataramanan Seshadri, Pittsburgh, PA (US); Christopher T. Brown, Pittsburgh, PA (US); Jessica Benson-Smith, Pittsburgh, PA (US); Edward S. Yang, Cheswick, PA (US)

(73) Assignee: Solvay USA, Inc., Cranbury, NJ (US)

( * ) Notice: Subject to any disclaimer, the term of this patent is extended or adjusted under 35 U.S.C. 154(b) by 502 days.

(21) Appl. No.: 12/422,159

(22) Filed: Apr. 10, 2009

(65) Prior Publication Data

US 2009/0256117 A1    Oct. 15, 2009

Related U.S. Application Data

(60) Provisional application No. 61/119,239, filed on Dec. 2, 2008, provisional application No. 61/044,380, filed on Apr. 11, 2008.

(51) Int. Cl.
| | |
|---|---|
| *H01B 1/00* | (2006.01) |
| *H01B 1/12* | (2006.01) |
| *H01L 51/40* | (2006.01) |
| *H01L 29/08* | (2006.01) |
| *H01L 35/24* | (2006.01) |
| *H01L 51/00* | (2006.01) |
| *H01G 9/028* | (2006.01) |
| *C08L 65/00* | (2006.01) |
| *C09D 11/52* | (2014.01) |
| *C08G 61/12* | (2006.01) |
| *H01L 51/50* | (2006.01) |
| *H01G 11/56* | (2013.01) |

(52) U.S. Cl.
    CPC ........... *C08L 65/00* (2013.01); *H01G 9/028* (2013.01); *H01L 51/0003* (2013.01); *C08G 2261/1424* (2013.01); *H01L 51/0037* (2013.01); *H01L 51/0007* (2013.01); *C09D 11/52* (2013.01); *C08G 2261/512* (2013.01); *Y02E 60/13* (2013.01); *C08G 61/126* (2013.01); *H01B 1/127* (2013.01); *H01L 51/5048* (2013.01); *Y02E 10/549* (2013.01); *H01G 11/56* (2013.01); *C08G 2261/3223* (2013.01)
    USPC  252/500; 257/40; 257/E51.027; 257/E51.029; 438/99

(58) Field of Classification Search
    USPC ............... 252/500; 438/99; 257/40, E51.027, 257/E51.029
    See application file for complete search history.

(56) References Cited

U.S. PATENT DOCUMENTS

| | | | |
|---|---|---|---|
| 4,356,429 A | | 10/1982 | Tang |
| 4,539,507 A | | 9/1985 | VanSlyke et al. |
| 4,737,557 A | | 4/1988 | Sato et al. |
| 4,810,613 A | | 3/1989 | Osuch et al. |
| 4,909,959 A | | 3/1990 | Lemaire et al. |
| 5,047,687 A | | 9/1991 | VanSlyke |
| 5,198,153 A | * | 3/1993 | Angelopoulos et al. ...... 252/500 |
| 5,247,190 A | | 9/1993 | Friend et al. |
| 5,401,827 A | | 3/1995 | Holmes et al. |
| 5,427,841 A | | 6/1995 | De Leeuw et al. |
| 5,454,880 A | | 10/1995 | Sariciftci et al. |
| 5,853,906 A | | 12/1998 | Hsieh |
| 5,968,674 A | | 10/1999 | Hsieh et al. |
| 6,166,172 A | | 12/2000 | McCullough et al. |
| 6,383,715 B1 | | 5/2002 | Lu et al. |
| 6,602,974 B1 | | 8/2003 | McCullough et al. |
| 6,812,399 B2 | | 11/2004 | Shaheen et al. |
| 6,933,436 B2 | | 8/2005 | Shaheen et al. |
| 7,070,867 B2 | | 7/2006 | Thompson et al. |
| 7,279,524 B2 | | 10/2007 | Ho et al. |
| 7,767,316 B2 | * | 8/2010 | Deaton et al. .................. 428/690 |
| 7,879,461 B2 | | 2/2011 | Iida et al. |
| 2004/0113127 A1 | | 6/2004 | Min et al. |
| 2004/0171790 A1 | | 9/2004 | Baik et al. |
| 2005/0042442 A1 | * | 2/2005 | Shinohara ..................... 428/336 |
| 2005/0123793 A1 | | 6/2005 | Thompson |
| 2005/0267264 A1 | * | 12/2005 | Takei et al. .................... 525/242 |
| 2006/0047030 A1 | * | 3/2006 | Yoshida et al. .................. 524/99 |
| 2006/0063030 A1 | * | 3/2006 | Deaton et al. ................... 428/690 |
| 2006/0076050 A1 | | 4/2006 | Williams et al. |
| 2006/0076541 A1 | | 4/2006 | Yoshida et al. |
| 2006/0078761 A1 | * | 4/2006 | Williams et al. ............... 428/690 |

(Continued)

FOREIGN PATENT DOCUMENTS

| | | |
|---|---|---|
| EP | 0 261 286 A1 | 3/1988 |
| WO | WO 2006/086480 A2 | 8/2006 |

(Continued)

OTHER PUBLICATIONS

Lermo et al. Odd-even effect in optically active poly (3,4-dialkoxythiophene). Chem. Communication. 1999, 791-792.*

(Continued)

*Primary Examiner* — Harold Pyon
*Assistant Examiner* — Tanisha Diggs
(74) *Attorney, Agent, or Firm* — The Marbury Law Group, PLLC

(57) ABSTRACT

Use of certain materials in hole injection or hole transport layers can improve the operational lifetimes in organic electronic devices. Compositions comprising a doped conjugated polymer, doped with a redox dopant, including iodonium salt, can increase lifetimes. Inks can be formulated and cast as films in organic electronic devices including OLEDs, PHOLEDs, and OPVs. One embodiment provides a composition with a conjugated polymer doped with a redox dopant. Non-aqueous based inks can be formulated. Iodonium salts can be used.

37 Claims, 2 Drawing Sheets

(56) References Cited

U.S. PATENT DOCUMENTS

| | | | |
|---|---|---|---|
| 2006/0175582 A1 | | 8/2006 | Hammond et al. |
| 2007/0077452 A1 | * | 4/2007 | Liu et al. ............ 428/690 |
| 2007/0176167 A1 | * | 8/2007 | Parthasarathy et al. ...... 257/40 |
| 2007/0207341 A1 | | 9/2007 | Iida et al. |
| 2007/0221914 A1 | | 9/2007 | Becker et al. |
| 2007/0272917 A1 | | 11/2007 | Cupertino |
| 2008/0146754 A1 | | 6/2008 | McCullough et al. |
| 2008/0248313 A1 | | 10/2008 | Seshadri et al. |
| 2010/0148124 A1 | * | 6/2010 | Reuter et al. ............ 252/500 |

FOREIGN PATENT DOCUMENTS

| | | | | |
|---|---|---|---|---|
| WO | WO 2006082945 A2 | * | 8/2006 | ............ C07F 5/02 |
| WO | WO 2007/002737 A2 | | 1/2007 | |
| WO | WO 2007011945 | * | 1/2007 | |
| WO | WO 2007085371 A1 | * | 8/2007 | |
| WO | WO 2008/018931 | | 2/2008 | |

OTHER PUBLICATIONS

Matthews et al. Non-ionic polythiophenes:a non-aggregating folded structure in water. Chem. Communication. 2005, 5503-5505.*
Official Notification with Written Opinion and Search Report mailed in counterpart Singapore Patent Application No. 201007255-1 on May 9, 2012.
U.S. Appl. No. 11/009,883, filed Dec. 10, 2004, Marks et al.
U.S. Appl. No. 61/044,380, filed Apr. 11, 2008, Brown.
U.S. Appl. No. 61/090,464, filed Aug. 20, 2008, Tuttle.
U.S. Appl. No. 61/119,239, filed Dec. 2, 2008, Brown et al.
U.S. Appl. No. 61/168,470, filed Apr. 10, 2009, Sheina.
Ash, *Industrial Solvents Handbook*, $2^{nd}$ Ed. (Syapse Information Resources, 2003).
Bredas and Silbey, eds. Conjugated Polymers, Kluwer Academic Press, Dordrecht (1991).
Campos et al., *Solar Energy Materials & Solar Cells*, 2006, 90, p. 3531-3546.
Cheremisnoff, *Industrial Solvents Handbook*, $2^{nd}$ Ed. (Marcel Dekker, Ney York, 2003).
Francois et al., *Synth. Met.*, 1995, 69, p. 463-466.
Friend, "Polymer LEDs," Physics World. Nov. 1992. 5, 11, p. 42-46.
Hansen et al., *Hanson Solubility Parameters: A User's Handbook*, (Taylor and Francis, 2007).
Hempenius et al., *J. Am. Chem. Soc.*, 1998, 120, p. 2798-2804.
Jenekhe et al., *Science*, 279, Mar. 20, 1998, p. 1903-1907.
*Journal of Polymer Science Part A, Polymer. Chem.* 1999, 37, p. 4241-4254.
Katz et al., "Organic Transistor Semiconductors," *Accounts of Chemical Research*, 2001, vol. 34, No. 5, p. 359, 365-367.
Kraft et al., "Electroluminescent Conjugated Polymers-Seeing Polymers in a New Light," Angew. Chem. Int. Ed. 1998, 37, p. 402-428.
Li et al., *Macromolecules*, 1999, 32, p. 3034-3044.
Liu et al., *Macromolecules*, 2002, 35, p. 9882-9889.
McCullough et al., "Regioregular, Head-to-Tail Coupled Poly(3-alkylthiophene) and its Derivatives," *Handbook of Conducting Polymers*, $2^{nd}$ Ed. 1998, Chapter 9, p. 225-258 and "Electroluminescence in Conjugated Polymers," Chapter 29, p. 823-846.
McCullough, "The Chemistry of Conducting Polythiophenes," *Adv. Mater.*, 1998, 10, No. 2., p. 93-116.
Noshay and McGrath, *Block Copolymers, Overview and Critical Survey*, Academic Press, 1977.
PCT/US2009/040257 filed Apr. 10, 2009, Intl Search Report and Written Opinion filed Jul. 29, 2009.
Roncali, *Chem. Rev.*, 1992, 92, 711.
Schopf et al., *Polythiophenes: Electrically Conductive Polymers*, Springer: Berlin, 1997.
*The Encyclopedia of Polymer Science and Engineering*, Wiley, 1990, p. 298-300.
Wang et al., *J. Am. Chem. Soc.*, 2000, 122, p. 6855-6861.
Widawski et al., *Nature* (London), Jun. 2, 1994, vol. 369, p. 387-389.
Wienk et al., *Applied Physics Letters*, 2006, 88, p. 153511.
Yagci et al., Macromolecular Chemistry and Physics, 206, 12, p. 1178-1182, 2005.
Yang et al., *Macromolecules*, 1993, 26, p. 1188-1190.

* cited by examiner

DOPED CONJUGATED POLYMERS, DEVICES, AND METHODS OF MAKING DEVICES

RELATED APPLICATIONS

This application claims priority to U.S. provisional application Ser. No. 61/044,380 filed Apr. 11, 2008, and to Ser. No. 61/119,239 filed Dec. 2, 2008, and both of these applications are incorporated herein by reference in their entireties.

BACKGROUND

Although useful advances are being made in energy saving devices such as organic-based organic light emitting diodes (OLEDs), polymer light emitting diodes (PLEDs), phosphorescent organic light emitting diodes (PHOLEDs), and organic photovoltaic devices (OPVs), further improvements are still needed in providing better processing and performance. For example, one promising type of material is conducting polymers including, for example polythiophenes. However, problems can arise with doping, purity, and solubility and processing. In particular, it is important to have very good control over the solubility of alternating layers of polymer (e.g., orthogonal or alternating solubility properties among adjacent layers). In particular, hole injection layers and hole transport layers can present difficult problems in view of competing demands and the need for very thin, but high quality, films.

A need exists for a good platform system to control properties of hole injection and transport layers such as solubility and electronic energy levels such as HOMO and LUMO, so that the materials can be adapted for different applications and to function with different materials such as light emitting layers, photoactive layers, and electrodes. In particular, good solubility and intractability properties are important. The ability to formulate the system for a particular application and provide the required balance of properties are also important.

SUMMARY

Embodiments described herein include, for example, compositions, methods of making and using the compositions, and devices and articles. Compositions include for example polymers, monomers, blends, films, dispersions, solutions, and ink formulations.

One embodiment provides, for example, a composition comprising at least one conjugated polymer mixed with at least one redox dopant. The redox dopant can be, for example, a sulfonium salt, an iodonium salt, or combinations thereof. In particular, an iodonium salt can be used.

Another embodiment provides, for example, a composition comprising at least one poly(3,4-dialkoxythiophene) mixed with at least one redox dopant, including in particular an iodonium salt.

Another embodiment provides, for example, a composition comprising at least one poly(3,4-dialkoxythiophene) doped with at least one iodonium salt.

Another embodiment provides, for example, a composition comprising a mixture of at least one conjugated polymer, at least one redox dopant mixed with the conjugated polymer, and a solvent carrier.

Another embodiment provides a composition comprising at least one conjugated polymer, wherein the conjugated polymer is poly(3,4-bis(2-(2-alkoxyethoxy)ethoxy) thiophene)-2,5-diyl.

Another embodiment provides a composition comprising at least one conjugated polymer, wherein the conjugated polymer is poly(3,4-bis(2-(2-butoxyethoxy)ethoxy) thiophene)-2,5-diyl.

Other embodiments provide devices prepared with use of these compositions and comprising compositions described herein.

At least one advantage from at least one embodiment described herein includes improvement in operational stability including, for example, long term stability and overall increased lifetime of an organic electronic device such as for example an OLED, PHOLED, or OPV device. In particular, improvements can be realized compared to use of PEDOT/PSS controls. In particular, properties such as current density and luminescence can be improved.

At least one additional advantage for at least one embodiment includes more flexibility in the formulation and building of an organic electronic device, such as for example an OLED, PHOLED, or OPV device. In particular, films made from the compositions described herein, upon casting and annealing, can be intractable to toluene. In particular, the compositions described herein can be used when it is desirable to cast subsequent layers of emissive layers. Additionally, the intractability to toluene or other solvents can enable orthogonal compatibility necessary for all solution processed devices, and can be used to create solution processed devices.

At least one additional advantage for at least one embodiment includes the absence of perfluorinated materials. In particular, compositions described herein have improved wetting characteristics of the cast films, thereby insuring improved good performance.

DETAILED DESCRIPTION

Introduction/Conducting and Conjugated Polymers

Figure 1:
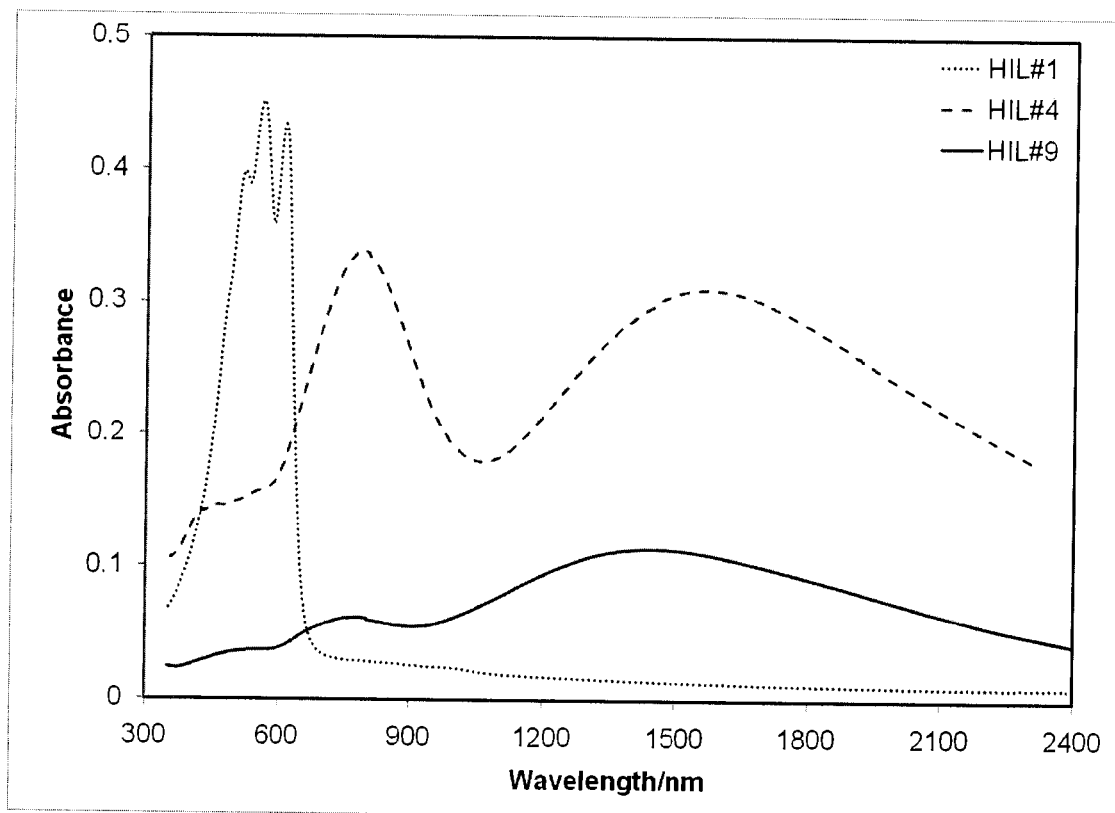
FIG. 1 illustrates a UV-vis-NIR spectra of films of poly(3, 4-bis(2-(2-butoxyethoxy)ethoxy)thiophene) doped with of IMDPIB(PhF$_5$)$_4$ and spun from chloroform.

Priority U.S. provisional application Ser. No. 61/044,380 filed Apr. 11, 2008, and Ser. No. 61/119,239 filed Dec. 2, 2008 are incorporated herein by reference in their entireties.

All references cited herein are incorporated by reference in their entirety.

The composition can comprise at least one conjugated polymer. Conjugated polymers are known in the art including their use in organic electronic devices. See for example Friend, "Polymer LEDs," Physics World, November 1992, 5, 11, 42-46; see for example Kraft et al., "Electroluminescent Conjugated Polymers-Seeing Polymers in a New Light," Angew. Chem. Int. Ed. 1998, 37, 402-428. In addition, electrically conductive or conjugated polymers are described in *The Encyclopedia of Polymer Science and Engineering*, Wiley, 1990, pages 298-300, including polyacetylene, poly (p-phenylene), poly(p-phenylene sulfide), polypyrrole, and polythiophene, including families of these polymers and derivatives in these polymer systems, which is hereby incorporated by reference in its entirety. This reference also describes blending and copolymerization of polymers, including block copolymer formation.

The conjugated polymer can be any conjugated polymer, including polythiophenes can be homopolymers, copolymers, or block copolymers. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mater.* 1998, 10, No. 2, pages 93-116, and references cited therein, which is hereby incorporated by reference in its entirety. Another reference which one skilled in the art can use is the *Handbook of Conducting Polymers*, 2nd Ed. 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety.

Polythiophenes are described, for example, in Roncali, J., *Chem. Rev.* 1992, 92, 711; Schopf et al., *Polythiophenes: Electrically Conductive Polymers*, Springer: Berlin, 1997. See also for example U.S. Pat. Nos. 4,737,557 and 4,909,959.

Polymeric semiconductors are described in, for example, "Organic Transistor Semiconductors" by Katz et al., *Accounts of Chemical Research*, vol. 34, no. 5, 2001, page 359 including pages 365-367, which is hereby incorporated by reference in its entirety.

Conjugated polymers can be for example copolymers including block copolymers. Block copolymers are described in, for example, *Block Copolymers, Overview and Critical Survey*, by Noshay and McGrath, Academic Press, 1977. For example, this text describes A-B diblock copolymers (chapter 5), A-B-A triblock copolymers (chapter 6), and -(AB)$_n$— multiblock copolymers (chapter 7), which can form the basis of block copolymer types in the present invention.

Additional block copolymers including polythiophenes are described in, for example, Francois et al., *Synth. Met.* 1995, 69, 463-466, which is incorporated by reference in its entirety; Yang et al., *Macromolecules* 1993, 26, 1188-1190; Widawski et al., *Nature (London)*, vol. 369, Jun. 2, 1994, 387-389; Jenekhe et al., *Science*, 279, Mar. 20, 1998, 1903-1907; Wang et al., *J. Am. Chem. Soc.* 2000, 122, 6855-6861; Li et al., *Macromolecules* 1999, 32, 3034-3044; Hempenius et al., *J. Am. Chem. Soc.* 1998, 120, 2798-2804.

Substituents which can be used to solubilize conducting polymers with side chains include alkoxy and alkyl including for example C1 to C25 groups, as well as heteroatom systems which include for example oxygen and nitrogen. In particular, substituents having at least three carbon atoms, or at least five carbon atoms can be used. Mixed substituents can be used. The substituents can be nonpolar, polar or functional organic substitutents. The side group can be called a substituent R which can be for example alkyl, perhaloalkyl, vinyl, acetylenic, alkoxy, aryloxy, vinyloxy, thioalkyl, thioaryl, ketyl, thioketyl, and optionally can be substituted with atoms other than hydrogen.

Conjugated polymers can comprise heterocyclic monomer repeat units, and heterocyclic polymers are particularly preferred. A particularly preferred system is the polythiophene system and the 3,4-disubstituted polythiophene system. Polymers can be obtained from Plextronics, Inc., Pittsburgh, Pa. including for example polythiophene-based polymers such as for example PLEXCORE, Plexcoat, and similar materials.

3,4-DISUBSTITUTED POLYTHIOPHENE

One important example of a conjugated polymer, and formulations and devices using the polymer, is a 3,4-disubstituted polythiophene. Preferably, the 3,4-disubstituted polythiophene may be a poly(3,4-dialkoxythiophene) or a poly(3,4-di-polyether)-thiophene. A polyether is a molecule with more than one ether group. The alkoxy and polyether side groups can donate electrons to the polymer backbone chain.

The 3,4-disubstituted polythiophene may have a symmetrical monomer repeating unit. Often times, the 3,4-disubstituted polythiophene comprises a 3,4-substituted thiophene as the repeating unit, with an oxygen atom directly attached to the 3- and 4-positions of the disubstituted thiophene and polymerized through the 2- and 5-positions. Substituents can be used to solubilize the 3,4-substituted thiophene with side chains that can include alkoxy and polyether, including for example, straight or branched carbon chains, for example, C1 to C25 groups, wherein one, two, three, four, five, or six of the carbon atoms in the chains may be replaced by heteroatoms, such as, oxygen and/or nitrogen.

The conjugated polymer may be prepared by polymerization of a monomer unit, such as 2,5-dibromo-3,4-bis(2-(2-butoxyethoxy)ethoxy)thiophene, or 2,5-dibromo-3,4-bis(2-(2-ethoxyethoxy)ethoxy)thiophene; 2,5-dibromo-3,4-bis(2-(2-methoxyethoxy)ethoxy)thiophene; 2,5-dibromo-3,4-bis(2-(2-butoxyethoxy)ethoxy)thiophene; 2,5-dibromo-3,4-bis(2-(2-butoxybutoxy)butoxy)thiophene; and 2,5-dibromo-3,4-bis(2-(2-methoxymethoxy)methoxy)thiophene.

Any known methods of polymerization may be used to obtain the 3,4-disubstituted polythiophene. Typically, the polymer itself can be obtained by GRIM polymerization of the 2,5-dibromo derivative of the dialkoxythiophene or dipolyetherthiophene using a Nickel catalyst.

GRIM polymerization of a symmetrical monomer is described in, for example, Campos et al., *Photovoltaic Activity of a PolyProDOT Derivative in a Bulk Heterojunction Solar Cell*, Solar Energy Materials & Solar Cells, August 2006.

The conjugated polymer can be a 3,4-disubstituted polythiophene, such as poly(3,4-bis(2-(2-butoxyethoxy)ethoxy)thiophene)-2,5-diyl; poly(3,4-bis(2-(2-ethoxyethoxy)ethoxy)thiophene)-2,5-diyl; poly(3,4-bis(2-(2-methoxyethoxy)ethoxy)thiophene)-2,5-diyl; poly(3,4-bis(2-(2-butoxyethoxy)ethoxy)thiophene)-2,5-diyl; poly(3,4-bis(2-(2-butoxybutoxy)butoxy)thiophene)-2,5-diyl; and poly(3,4-bis(2-(2-methoxymethoxy)methoxy)thiophene)-2,5-diyl.

Typically, the conjugated polymer is a 3,4-disubstituted polythiophene represented by:

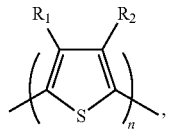

wherein independently $R_1$ can be an optionally substituted alkoxy group or an alkoxy heteroatom group, such as, for example, an alkoxyalkoxyalkoxy moiety, and independently $R_2$ can be an optionally substituted alkoxy group alkoxy heteroatom group, such as, for example, an alkoxyalkoxyalkoxy moiety; or wherein independently $R_1$ can be optionally substituted alkyl, and optionally substituted aryloxy, and independently $R_2$ can be optionally substituted alkyl, and optionally substituted aryloxy. Examples of substituents for the optional substitution include hydroxyl, phenyl, and additional optionally substituted alkoxy groups. The alkoxy groups can be in turn optionally substituted with hydroxyl, phenyl, or alkoxy groups; or wherein independently $R_1$ can be an optionally substituted alkylene oxide, and independently $R_2$ can be an optionally substituted alkylene oxide. Substituents can be for example hydroxyl, phenyl, or alkoxy groups; or wherein independently $R_1$ can be optionally substituted ethylene oxide or optionally substituted propylene oxide or other lower alkyleneoxy units, and independently $R_2$ can be optionally substituted ethylene oxide or optionally substituted propylene oxide or other lower alkyleneoxy units. Substituents can be for example hydroxyl, phenyl, or alkoxy groups; or wherein independently $R_1$ can be an optionally substituted alkylene such as for example methylene or ethylene, with substituents being for example optionally substituted alkyleneoxy such as ethyleneoxy or propyleneoxy; substituents can be for example hydroxyl, phenyl, or alkoxy, and independently $R_2$ can be an optionally substituted alkylene such as for example methylene or ethylene, with substituents being for example optionally substituted alkyleneoxy such as ethyleneoxy or propyleneoxy; substituents can be for example hydroxyl, phenyl, or alkoxy.

In addition, the substituent groups $R_1$ and $R_2$ can be linked to the thiophene by an oxygen atom such as alkoxy or phenoxy, wherein the substituent can be characterized by the corresponding alcohol or phenol, respectively. The alcohol, for example, can be linear or branched, and can have C2-C20, or C4-C18, or C6 to C14 carbon atoms. The alcohol can be for example an alkyl alcohol, or an ethylene glycol, or a propylene glycol, or a diethylene glycol, or a dipropylene glycol, or a tripropylene glycol. Additional examples can be monoethylene glycol ethers and acetates, diethylene glycol ethers and acetates, triethylene glycol ethers and acetates, and the like. Examples of alcohols which can be linked to the thiophene ring through the oxygen atom include hexyl cellosolve, Dowanol PnB, ethyl carbitol, Dowanol DPnB, phenyl carbitol, butyl cellosolve, butyl carbitol, Dowanol DPM, diisobutyl carbinol, 2-ethylhexyl alcohol, methyl isobutyl carbinol, Dowanol Eph, Dowanol PnP, Dowanol PPh, propyl carbitol, hexyl carbitol, 2-ethylhexyl carbitol, Dowanol DPnP, Dowanol TPM, methyl carbitol, Dowanol TPnB. The trade names are well known in this art. Polythiophene substituents, including various alkoxy and polyether substituents, and formulations are described in for example U.S. patent application Ser. No. 11/826,394 filed Jul. 13, 2007 (US publication 2008/0248313).

The degree of polymerization n is not particularly limited but can be for example 2 to 500,000 or 5 to 100,000 or 10 to 10,000, or 10 to 1,000, 10 to 500, or 10 to 100. In many cases, and polymer has a number average molecular weight between approximately 5,000 and 100,000 g/mol. In some embodiments, R can be a monoalkoxy, dialkoxy, trialkoxy, or tetraalkoxy group and the conjugated polymer is a poly(3,4-dialkoxythiophene) or poly(3,4-dipolyetherthiophene).

In one embodiment, $R_1$ is a butoxyethoxy(ethoxy), $R_2$ is a butoxyethoxy(ethoxy), and the polymer is a poly-3,4-bis(2-(2-butoxyethoxy)ethoxy)thiophene-2,5-diyl represented by:

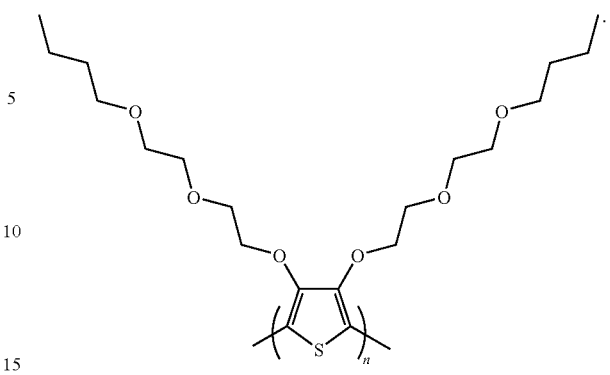

The degree of polymerization n is not particularly limited but can be for example 2 to 500,000 or 5 to 100,000 or 10 to 10,000, or 10 to 1,000, or 10 to 100. In many cases, and polymer has a number average molecular weight between approximately 5,000 and 100,000 g/mol.

In another embodiment, the $R_1$ is a methoxyethoxy (ethoxy) and $R_2$ is a methoxyethoxy(ethoxy), and the repeat unit is a 3,4-bis(2-(2-methoxyethoxy)ethoxy)thiophene-2,5-diyl represented by:

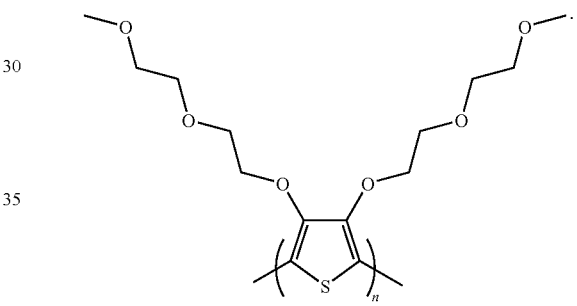

The degree of polymerization n is not particularly limited but can be for example 2 to 500,000 or 5 to 100,000 or 10 to 10,000, or 10 to 1,000, or 10 to 100. In many cases, and polymer has a number average molecular weight between approximately 5,000 and 100,000 g/mol.

In other embodiments the repeat unit can be, for example, 3,4-bis(2-(2-ethoxyethoxy)ethoxy)thiophene-2,5-diyl; 3,4-bis(2-(2-butoxybutoxy)butoxy)thiophene-2,5-diyl; 3,4-bis(2-(2-methoxymethoxy)methoxy)thiophene-2,5-diyl; and the like.

The choice of side chains in the 3- and 4-positions, including the terminal capping groups, can help to impart intractability of the doped conjugated polymer to certain solvents, for example toluene, tetrahydrofuran (THF), or chloroform. The intractability to solvents can enable orthogonal compatibility which is necessary for solution processed devices. This intractability can allow the conjugated polymer to be used as an HIL that is first formulated into an HIL ink to be used in the preparation of devices that are manufactured using solution processes with other ink systems used from adjacent layers. Also, a longer chain terminal groups such as butyl compared to methyl can increase solubility in less polar solvents like toluene. The choice of terminal group can also impact thermal stability in the doped and undoped form. In some embodiments, a butyl terminal group can provide better stability properties compared to a methyl group. Additionally, side chain choice, including the terminal capping groups, can alter the dielectric constant between interfaces, which may affect charge transport across the interfaces.

In one embodiment, the conjugated polymer in either the neutral or oxidized state, is soluble and/or dispersible in an aromatic hydrocarbon solvent. In another embodiment, the conjugated polymer may be soluble in tetrahydrofuran (THF) and/or chloroform.

After polymerization, the conjugated polymer typically has a number average molecular weight between approximately 1,000 and 1,000,000 g/mol. More typically, the polymer has a number average molecular weight between approximately 5,000 and 100,000 g/mol.

The polymer can be treated so as to remove impurities such as, for example, metals. The removal of impurities can improve device performance such as, for example, improve efficiency, lifetime, or other parameters in, for example, OLED or OPV testing. Purification can be carried out in a way to remove metals even if some metals can be complexed with alkyleneoxy side groups via oxygen atom binding.

In addition, the polymer can be treated to tailor the end groups. End group modification is known in the art. See, for example, J. Liu et al., *Macromolecules,* 2002, 35, 9882-9889 including Scheme 3 where bromine end group is converted to hydrogen end group via a Grignard reagent. In one embodiment, the polymer can be treated to remove any halogen end groups such as, for example, bromine end groups. This can be called a dehalogenation process. See, for example, Elena Sheina, U.S. Provisional Application Ser. No. 61/168,470, filed concurrently herewith on Apr. 10, 2009 (assignee: Plextronics, Inc.) and incorporated by reference herein in its entirety. In one embodiment, the polymer can be treated with a Grignard reagent (see also, for example, magnesium reagents described in US Patent Publication 2008/0146754 to Iovu et al., "Universal Grignard Metathesis Polymerization." The control of the amount of halogen can improve device performance such as, for example, improve efficiency, lifetime, or other parameters in, for example, OLED or OPV testing. Dehalogenation can be carried out in a way to minimize introduction of defects or impurities into the polymer.

Redox/Dopant

The conjugated polymer can be mixed with a dopant. A reaction can occur upon mixing. In particular, the conjugated polymer can be doped with a redox dopant. A redox dopant can be, for example, a material that will undergo one or more electron transfer reaction(s) with, for example, a conjugated polymer, thereby yielding a doped conjugated polymer. A redox dopant may undergo one or more electron transfer reaction(s) with a conducting polymer, thereby yielding a doped conducting polymer. The redox dopant can be selected to provide a suitable charge balancing counter-anion. As discussed herein, the conjugated polymer and the dopant, or redox dopant, can refer to components that will react to form a doped polymer. The doping reaction can be a charge transfer reaction, wherein charge carriers are generated, and the reaction can be reversible or irreversible. Redox dopants are known in the art. See, for example, U.S. Pat. No. 7,070,867; or Publication No. 2005/0123793; 2004/0113127.

In the final formulation, the composition can be distinctly different from the combination of original components (i.e., conjugated polymer and/or redox dopant may or may not be present in the final composition in the same form before mixing). Some embodiments allow for removal of reaction byproducts from the doping process. For example the iodonium redox dopant can result in organic byproducts that can be washed away from the doped polymer.

Examples of suitable redox dopants that are known in the art include, but are not limited to, quinones, boranes, carbocations, bora-tetraazapentalenes, aminium or ammonilium salts, sulfonium salts, oxonium salts, selenonoium salts, nitrosonium salts, arsonium salts, phosphonium salts, iodonium salts, select metal (e.g. silver) salts, or combinations thereof. Suitable redox dopants include the salts as described, but not limited to, in U.S. Pat. Nos. 5,853,906 and 5,968,674, which are hereby incorporated by reference in their entirety. See also, for example, US Patent Publication 2007/0207341 to Iida et al.

The redox dopant may be a photoacid. See, for example, U.S. Pat. Nos. 6,383,715; 4,810,613; or Publication Nos. 2007/0221914; 2007/0272917; 2007/0176167; U.S. Pat. No. 7,279,524. Examples of suitable photoacids include, but are not limited to, sulfonium and iodonium salts. The redox dopant can be a photoinitiator. See, for example, Yagci et al., Macromolecular Chemistry and Physics, 206, 12, 1178-1182, including description of UV irradiation inducing polymerization of thiophene in presence of diphenyliodonium hexafluorophosphate as photoinitiator.

The type of dopant anion can affect the doping level of the conjugated polymer and on device performance for devices prepared from these solutions.

The size of the dopant anion can be an important parameter for enhancing the efficiency of a device. The anion can be a borate anion, a hexafluorophosphate anion, antimoniate, a sulfonate anion, a halide such as a fluoride anion, a chloride anion, a bromide anion, an iodide anion, a tetrafluoroborate anion, a hexafluorophosphate anion, an optionally substituted arylsulfonate anion, an optionally substituted alkylsulfonate anion, a perfluoroalkylsulfonate anion, an optionally substituted tetraarylborate anion, or an optionally substituted tetraalkylborate anion.

A halogenated borate can be optionally substituted with, for example, alkyl, aryl, partially fluorinated alkyl, partially fluorinated alkyl ether, partially fluorinated aryl, perfluorinated alkyl, perfluorinated alkyl ether, and/or perfluorinated aryl.

A halogenated phosphate can be optionally substituted with, for example, alkyl, aryl, partially fluorinated alkyl, partially fluorinated alkyl ether, partially fluorinated aryl, perfluorinated alkyl, perfluorinated alkyl ether, and/or perfluorinated aryl.

A halogenated antimonate can be optionally substituted with, for example, alkyl, aryl, partially fluorinated alkyl, partially fluorinated alkyl ether, partially fluorinated aryl, perfluorinated alkyl, perfluorinated alkyl ether, and/or perfluorinated aryl.

A halogenated sulfonate can be optionally substituted with, for example, alkyl, aryl, partially fluorinated alkyl, partially fluorinated alkyl ether, partially fluorinated aryl, perfluorinated alkyl, perfluorinated alkyl ether, and/or perfluorinated aryl.

Other embodiments include sulfonimides which can be optionally substituted with, for example, alkyl, aryl, partially fluorinated alkyl, partially fluorinated alkyl ether, partially fluorinated aryl, perfluorinated alkyl, perfluorinated alkyl ether, and/or perfluorinated aryl. Examples of sulfonimides include alkyl and aryl sulfonimides such as, for example, bis(trifluoromethanesulfonimide) and bi(benzenesulfonimide).

The dopant may be an onium salt as described in *Journal of Polymer Science Part A, Polymer Chem.* 37, 4241-4254, 1999, hereby incorporated by reference in its entirety. Iodonium salts are known in the art. Doping of a neutral polythiophene can be achieved using photoacids, such as iodonium salts or diaryl iodonium salts, and in particular, diphenyl iodonium salts. The aryl groups such as a phenyl group in the iodonium salt can be optionally substituted as known in the art. The redox dopant may be a lipophilic iodonium salt. Typically, the iodonium salt is represented by:

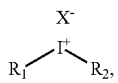

wherein independently R$_1$ is an optionally substituted aryl group, independently R$_2$ is an optionally substituted aryl group, and X$^-$ is an anion.

Doping of the neutral polythiophene can be achieved using photoacids, such as, a sulfonium salt. Sulfonium salts are known in the art. The aryl groups in the sulfonium salt can be optionally substituted as known in the art. Typically, the sulfonium salt is represented by:

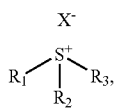

wherein independently R$_1$ is an optionally substituted arene, independently R$_2$ is a optionally substituted arene, R$_3$ is a optionally substituted arene, and X$^-$ is an anion.

The dopant can comprise an optionally substituted diphenyl iodonium salt with a molecular weight of, for example, about 100 g/mol to about 500 g/mol, or approximately 300 g/mol.

In one embodiment, the dopant is the photoacid, 4-isopropyl-4'-methyldiphenyliodonium tetrakis(pentafluorophenylborate) (IMDPIB(PhF$_5$)$_4$), represented by:

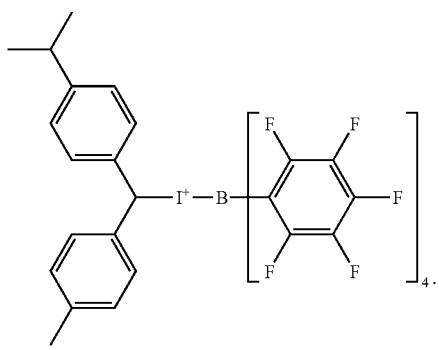

In one embodiment of a PHOLED, an HIL layer comprising the IMDPIB(F$_5$Ph$_4$) photoacid is mixed with the poly(3,4-bis(2-(2-butoxyethoxy)ethoxy)thiophene) polymer. The device performance measured by determining the voltage and brightness at a given current density (for example 10 mA/cm$^2$). Optimum device performance can be judged by the lowest voltage and highest brightness at a given current density. For example, a PHOLED comprising an HIL layer comprising the IMDPIB(F$_5$Ph$_4$) photoacid mixed with the poly (3,4-bis(2-(2-butoxyethoxy)ethoxy)thiophene) polymer can provide a voltage of 4.85 V and a brightness of 310 cd/m$^2$.

Other iodonium salts may be used. For example, another iodonium salt that may be used diphenyliodonium hexafluorophosphate (DPIPF$_6$), represented by:

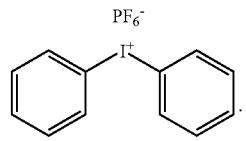

Another iodonium salt that may be used is diphenyliodonium para-toluene sulfonate (DPITos), represented by:

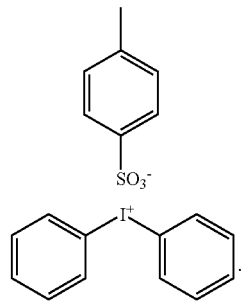

Another iodonium salt that may be used is bis-(4-tert-butylphenyl) iodonium trifluoromethane sulfonate ($^t$BD-PITFSO$_3$), represented by:

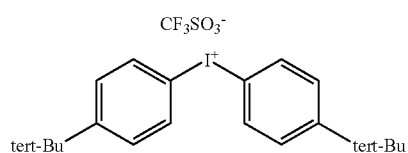

Another iodonium salt that may be used is diphenyliodonium perfluoro-1-butane sulfonate (DPIPFBSO$_3$), represented by:

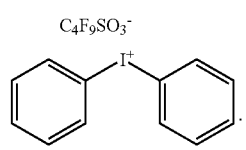

The iodonium salt can be a low molecular weight compound or it can be coupled to a high molecular compound such as a polymer.

The redox dopant may be a sulphonium salt. For example, a sulphonium salt that may be used triphenylsulphonium hexafluorophosphate represented by:

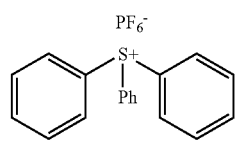 [SMILES: c1ccc([S+](c2ccccc2)c2ccccc2)cc1 ; "PF6-"]

Another sulphonium salt that may be used is triphenylsulphonium para-toluene sulfonate, represented by:

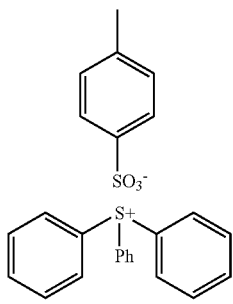

Another sulphonium salt that may be used is bis-(4-tert-butylphenyl) sulphonium trifluoromethane sulfonate represented by:

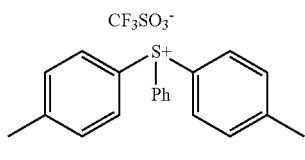

Another sulphonium salt that may be used is diphenylsulphonium perfluoro-1-butane sulfonate represented by:

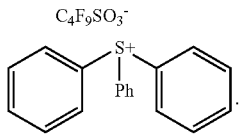

Other onium salts may be used provided such that effective doping can be achieved for select counterions.

Another class of dopants that can be used includes quinones. Examples of quinones that may be used to effect doping include, but are not limited to, tetrafluorotetracyano-p-quinodimethane ($F_4TCNQ$), trifluorotetracyano-p-quinodimethane ($F_3TCNQ$), difluorotetracyano-p-quinodimethane ($F_2TCNQ$), fluorotetracyano-p-quinodimethane (FTCNQ), dichloro dicyanoquinine (DDQ), o-chloranil and cyanil.

Another class of dopants that can be used includes ammonium salts. Ammonium radical cations can be used as a redox additive to the formulation to undergo electron transfer. The byproducts formed, need not necessarily be removed from the composition, as they are also hole transporting moieties and are less likely to adversely affect transport. One example of an ammonium salt is tris-(4-bromophenyl)amine antimony hexachloride, represented by:

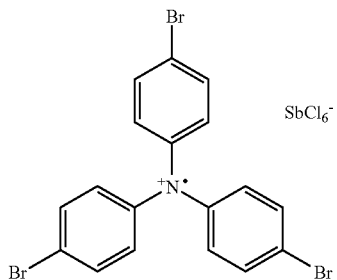

Other useful redox dopants include bora-tetraazapentalenes. One example of a bora-tetraazapentalene is represented by:

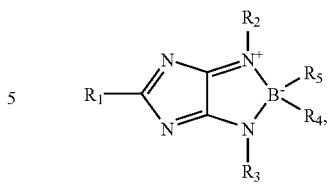

wherein independently $R_1$, $R_2$, $R_3$ are hydrogen, an optionally substituted or unsubstituted alkyl, a heteroalkyl, an aryl, a heteroaryl, a fused carbocycle or a fused heterocycle group, and wherein independently $R_4$ and $R_5$ are a halogen, hydrogen, an optionally substituted or unsubstituted alkyl, a heteroalkyl, an aryl, a heteroaryl, a fused carbocycle or fused heterocycle, or together with the boron atom a boron-containing heterocycle.

Another class of useful dopants is a silver salt, such as silver tetrafluoroborate, silver tetraphenylborate, or silver hexafluorophosphate. Silver ions may undergo electron transfer to or from silver metal and the conducting polymer salt.

The compositions can be free of ionic polymers such as, for example, poly(styrene sulfonate) (PSS) and protic materials.

Dopants can be used which mix well with the polymer, the solvent system, and the ink formulations. Dopants can be avoided which result in phase separation. Dopants can be obtained from Novaled AG (Dresden, Germany). See also, for example, WO 2007/115540, published Oct. 18, 2007, (Novaled AG).

The polymer, dopant, solvent system, and other components, if used, can be formulated to provide good shelf stability and good stability in general, both before and after solvent removal, and under conditions of environmental stress. Thermal methods like thermal gravimetric analysis can be used to measure thermal stability. For example, the rate at which weight decline occurs as temperature is raised can be measured, and decomposition onset and rate of maximum reduction in weight can be measured. Glass transition temperature can be measured also by thermal analysis such as DSC (differential scanning calorimetry).

Solvent System

A variety of commonly used polymeric HILs are prepared using strongly acidic polymers as dopants and binders, see for example, PEDOT-PSS. These systems using the strongly acidic polymers as dopants and binders can perform poorly with PHOLED systems which are more efficient and a natural choice for lighting.

Different solvents can be used in the current solvent system. Typically, the solvents used are organic non-polar solvents. More typically, the solvents used are aprotic non-polar solvents. Use of aprotic non-polar solvents can provide, in at least some examples, the additional benefit of increased lifetimes of devices with emitter technologies which are sensitive to protons. Examples of such devices include PHOLEDs.

Common solvents used in the present solvent system include aromatic hydrocarbons in the neutral and oxidized forms. Solvents such as tetrahydrofuran, chloroform, or aromatic hydrocarbons in the neutral and oxidized forms are used. Additional solvents include tetrahydrofuran, chloroform, alkylated benzenes, halogenated benzenes, NMP, DMF, DMAc, DMSO, methyl ethyl ketone, cyclohexanone, chloroform, dichloromethane, acetone, THF, dioxanes, ethyl acetate, ethyl benzoate, ethylene carbonate, propylene carbonate, or combinations thereof. The conjugated polymer is typically highly soluble and highly processable in these solvents.

For environmental compliance, one or more nonhalogenated solvents may be selected. Halogenated solvents can be substantially or totally excluded (e.g., used in less than 10%, or less than 5%, or less than 1%, or less than 0.1% by volume of total solvent carrier. In weighing such additional factors, it may be helpful to consult references such as, for example, Cheremisnoff, N. P., *Industrial Solvents Handbook, 2nd* Ed. (Marcel Dekker, New York, 2003); Ash, M, *Handbook of Solvents, 2nd* Ed. (Syapse Information Resources, 2003); Wypych, G., *Handbook of Solvents (Chemical)* (Noyes Publications, 2000); Hansen, C. M., Durkee, J. and Kontogeorgis, G, *Hanson Solubility Parameters: A User's Handbook* (Taylor and Francis, 2007); all of which are incorporated by reference in their entireties. For a more detailed discussion regarding selection of solvent systems comprising two or more solvents, see U.S. 61/090,464, filed Aug. 20, 2008, (043419-0256) which is incorporated by reference it its entirety.

Alternatively, it may be useful to select more than one solvent to use in the solvent system.

Other solvents might also be considered, that solubilize the conjugated polymer, that swell the conjugated polymer, or that even act as non-solvents for the polymer. The latter may be included in the solvent system in varying quantities to modify ink properties such as wetting, viscosity, morphology control.

Solvents to be considered may include ethers (optionally substituted with C1-C10 alkyl chains) such as anisole, ethoxybenzene, dimethoxy benzenes and glycol ethers, such as: ethylene glycol diethers such as 1,2-dimethoxy ethane, 1,2-diethoxy ethane, 1,2-dibutoxy ethane; diethylene glycol diethers such as diethylene glycol dimethyl ether, diethylene glycol diethyl ether; propylene glycol diethers such as propylene glycol dimethyl ether, propylene glycol diethyl ether, propylene glycol dibutyl ether; dipropylene glycol diethers such as dipropylene glycol dimethyl ether, dipropylene glycol diethyl ether, dipropylene glycol dibutyl ether; also, higher analogs (tri- and tetra-) of the ethylene glycol and propylene glycol ethers mentioned above.

Still other solvents can be considered, such as ethylene glycol monoether acetates and propylene glycol monoether acetates, wherein the ether can be selected, for example, from: methyl, ethyl, n-propyl, iso-propyl, n-butyl, sec-butyl, tert-butyl, cyclohexyl. Also, higher glycol ether analogs of above list such as di-, tri- and tetra-. Examples include, but are not limited to, propylene glycol methyl ether acetate, 2-ethoxyethyl acetate, 2-butoxyethyl acetate.

Yet other possible solvents include aliphatic and aromatic ketones such as acetonyl acetone, methyl isobutyl ketone, methyl isobutenyl ketone, 2-hexanone, 2-pentanone, acetophenone, ethyl phenyl ketone, cyclohexanone, cyclopentanone.

Additional possible solvents include N,N-dimethyl formamide, N,N-dimethyl acetamide, N-methylpyrrolidone, dimethyl sulfoxide, tetramethylene sulfoxide, acetonitrile, benzonitrile, ethylene carbonate, propylene carbonate, and the like.

Other examples include cyclic ethers such as, for example, tetrahydropyran (THP). Solvent can be used such that polymerization of the solvent can be avoided. Another example is methoxyproprionitrile.

The one or more solvents can be used in varying proportions to improve the ink characteristics such as substrate wettability, ease of solvent removal, viscosity, surface tension, and jettability.

The composition comprising the conjugated polymer, dopant and solvent can be cast and annealed as a film on a substrate optionally containing an electrode or additional layers used to improve electronic properties of the final device. The films may be intractable to an organic solvent, which can be the solvent in the ink for subsequently coated or deposited layers during fabrication of a device. The films may be intractable to toluene, which can be the solvent in the ink for subsequently coated or deposited layers during fabrication of a device.

Film formation can be carried out by methods known in the art including for example spin casting, dip casting, dip coating, slot-dye coating, ink jet printing, gravure coating, doctor blading, and any other methods known in the art for fabrication of, for example, organic electronic devices.

Second Polymer

In some embodiments, the composition comprises at least one synthetic polymer that is different from the conjugated polymer. See for example US Patent Publication No. 2006/0175582 published Aug. 10, 2006. The synthetic polymer can comprise, for example, a carbon backbone. In some embodiments, the synthetic polymer has at least one polymer side group comprising an oxygen atom or a nitrogen atom. The synthetic polymer may be a Lewis base. Typically, the synthetic polymer comprises a carbon backbone and has a glass transition temperature of greater than 25° C. The synthetic polymer may comprise acidic groups. Additionally, the conjugated polymer may comprise acidic groups. In some embodiments, both the conjugated polymer and the second polymer comprise acidic groups.

The second polymer can be a planarizing agent. A planarizing agent may be comprised of, for example, a polymer or oligomer such as an organic polymer such as poly(styrene) or poly(styrene) derivatives, poly(vinyl acetate) or derivatives thereof, poly(ethylene glycol) or derivatives thereof, poly(ethylene-co-vinyl acetate), poly(pyrrolidone) or derivatives thereof (e.g., poly(1-vinylpyrrolidone-co-vinyl acetate)), poly(vinyl pyridine) or derivatives thereof, poly(methyl methacrylate) or derivatives thereof, poly(butyl acrylate), poly(aryl ether ketones), poly(aryl sulfones), poly(aryl ether sulfones), poly(esters) or derivatives thereof, or combinations thereof.

More generally, a planarizing agent can be comprised of polymers or oligomers built from monomers such as $CH_2CHAr$, where Ar=any aryl or functionalized aryl group, isocyanates, ethylene oxides, conjugated dienes, $CH_2CHR_1R$ (where $R_1$=alkyl, aryl, or alkyl/aryl functionalities and R=H, alkyl, Cl, Br, F, OH, ester, acid, or ether), lactam, lactone, siloxanes, and ATRP macroinitiators. A planarizing agent can also be a polymer comprising optionally substituted fused aromatic rings or optionally substituted polycyclic aromatic hydrocarbon side groups. Additionally, the hole-transporting compounds described below can also be planarizing agents.

Hole-Transporting Compound

In some embodiments, the composition comprises a hole-transporting compound. The hole-transporting compound is a small molecule or a polymer comprised of repeat units comprising hole-transporting units in the main-chain and/or in a side-chain, wherein hole-transporting units comprise the hole-transporting compound. The hole-transporting compound may be in the neutral form or may be doped. Examples of hole-transporting compounds or polymers can be found in pending U.S. application Ser. No. 11/009,883, which is hereby incorporated by reference.

The hole-transporting compound may be soluble in organic solvents, such as toluene or THF. Typically, hole-transporting compounds are used for fabrication of light emitting displays and other applications. The hole-transporting compounds may also be a planarizing agent.

One hole-transporting compound that may be used is 1,4-bis(diphenylamino)benzene, represented by:

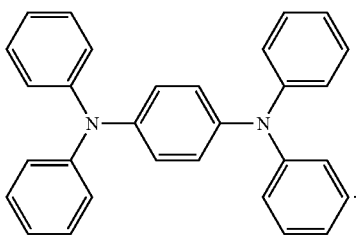 [SMILES: c1ccc(N(c2ccccc2)c2ccc(N(c3ccccc3)c3ccccc3)cc2)cc1]

Another hole-transporting compound that may be used is N—N'-bis(3-methylphenyl)-N—N'-bis(phenyl)benzidine, represented by:

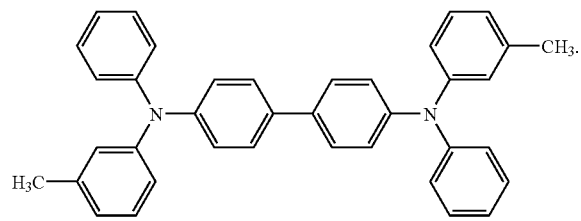 [SMILES: Cc1cccc(N(c2ccccc2)c2ccc(-c3ccc(N(c4ccccc4)c4cccc(C)c4)cc3)cc2)c1]

Another hole-transporting compound that may be used is N—N'-bis(4-methylphenyl)-N—N'-bis(phenyl)benzidine, represented by:

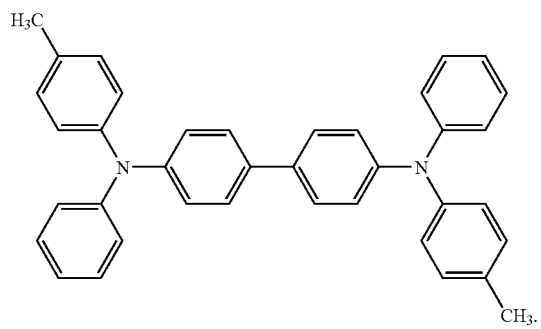 [SMILES: Cc1ccc(N(c2ccccc2)c2ccc(-c3ccc(N(c4ccccc4)c4ccc(C)cc4)cc3)cc2)cc1]

Another hole-transporting compound that may be used is N—N'-Bis(2-naphtalenyl)-N—N'-bis(phenyl)benzidine, represented by:

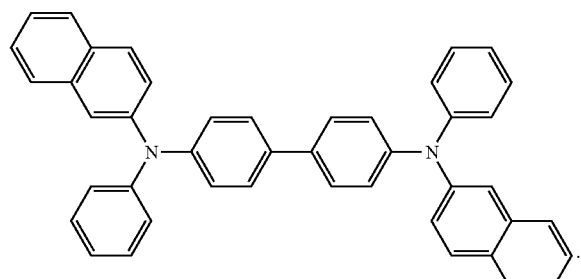

Another hole-transporting compound that may be used is 1,3,5-tris(3-methyldiphenyl amino)benzene, represented by:

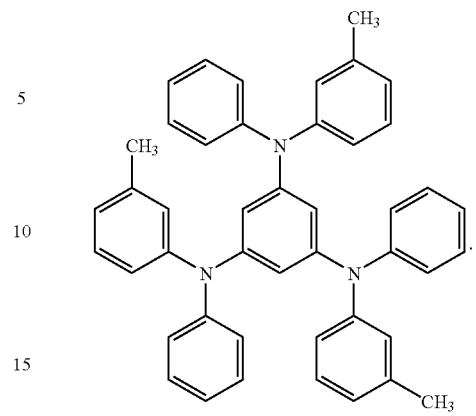

Another hole-transporting compound that may be used is 1,3,5-tris[(3-methylphenyl)phenylamino]benzene, represented by:

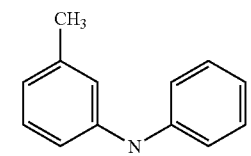

Another hole-transporting compound that may be used is tris(4-carbazoyl-9-ylphenyl)amine, represented by:

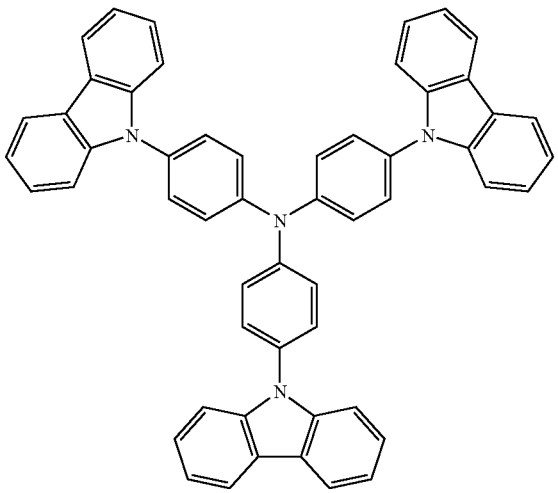 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]

Another hole-transporting compound that may be used is tri-p-tolylamine, represented by:

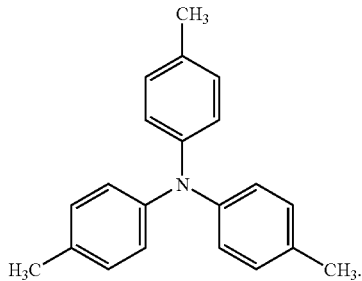 [SMILES: Cc1ccc(N(c2ccc(C)cc2)c2ccc(C)cc2)cc1]

Another hole-transporting compound that may be used is N—N'-bis(1-naphtalenyl)-N—N'-bis(phenyl)benzidine, represented by:

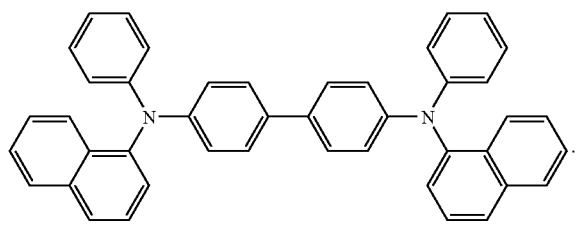 [SMILES: c1ccc(N(c2ccc(-c3ccc(N(c4ccccc4)c4cccc5ccccc45)cc3)cc2)c2cccc3ccccc23)cc1]

Another hole-transporting compound that may be used is 4,4',4"-tris(N—N-phenyl-3-methylphenylamino)triphenylamine, represented by:

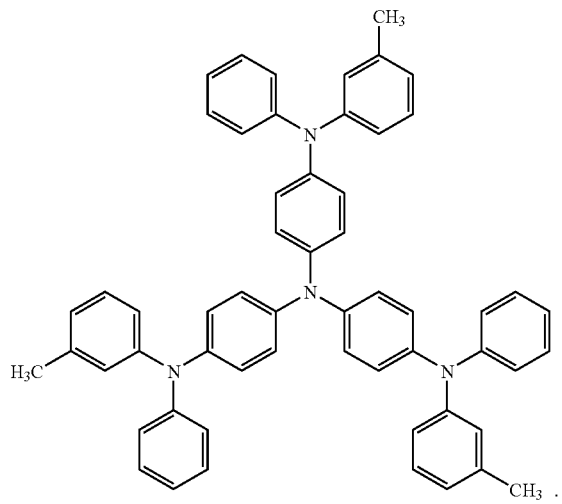 [SMILES: Cc1cccc(N(c2ccccc2)c2ccc(N(c3ccc(N(c4ccccc4)c4cccc(C)c4)cc3)c3ccc(N(c4ccccc4)c4cccc(C)c4)cc3)cc2)c1]

Another hole-transporting compound that may be used is 1,3,5-tris(diphenylamino)benzene, represented by:

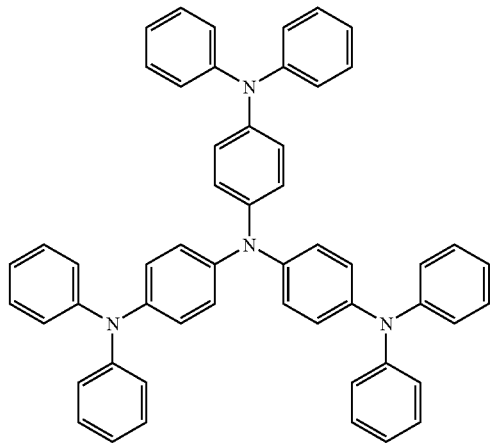

Another hole-transporting compound that may be used is titanyl phthalocyanine, represented by:

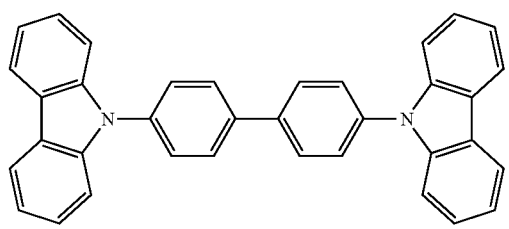

Another hole-transporting compound that may be used is 1,3,5-tris(2-(9-ethylcabazyl-3)ethylene)benzene, represented by:

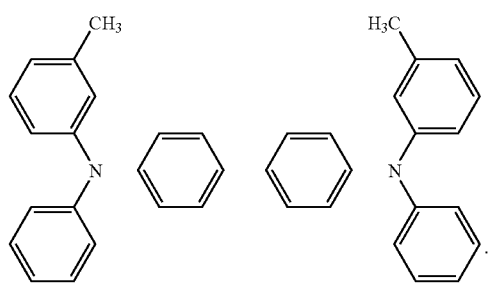

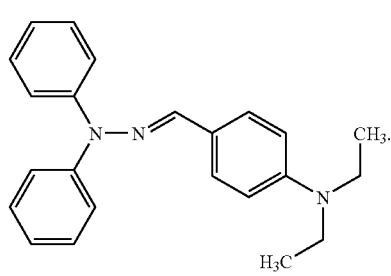 [SMILES: CCN(CC)c1ccc(/C=N/N(c2ccccc2)c2ccccc2)cc1]

Another hole-transporting compound that may be used is 4-(dimethylamino)benzaldehyde diphenylhydrazone, represented by:

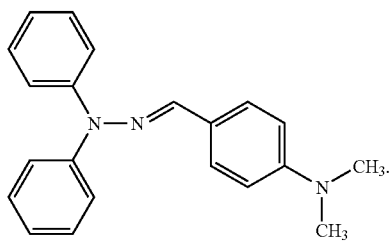 [SMILES: CN(C)c1ccc(/C=N/N(c2ccccc2)c2ccccc2)cc1]

Another hole-transporting compound that may be used is 4-(dimethylamino)benzaldehyde diphenylhydrazone, represented by:

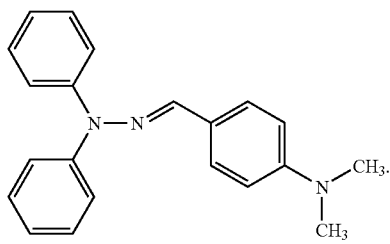 [SMILES: CN(C)c1ccc(/C=N/N(c2ccccc2)c2ccccc2)cc1]

Another hole-transporting compound that may be used is 4-(diphenylamino)benzaldehyde diphenylhydrazone, represented by:

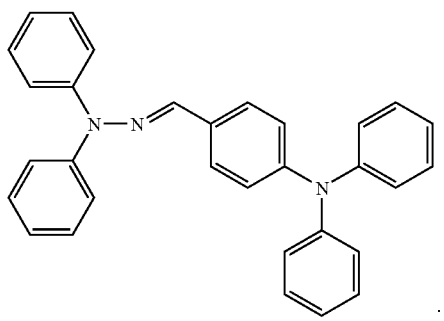 [SMILES: C(=N\N(c1ccccc1)c1ccccc1)/c1ccc(N(c2ccccc2)c2ccccc2)cc1]

Another hole-transporting compound that may be used is 4-(dibenzylamino)benzaldehyde-N,N-diphenylhydrazone, represented by:

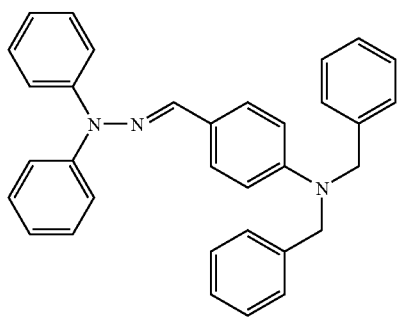

Another hole-transporting compound that may be used is tris[4-(diethylamino)phenyl]amine, represented by:

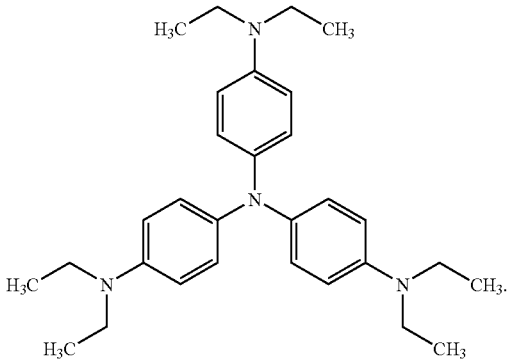 [SMILES: CCN(CC)c1ccc(N(c2ccc(N(CC)CC)cc2)c2ccc(N(CC)CC)cc2)cc1]

Another hole-transporting compound that may be used is 9-ethyl-3-carbazolecarboxaldehyde diphenylhydrazone, represented by:

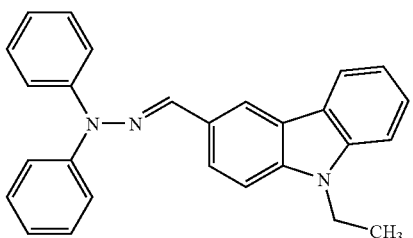

Another hole-transporting compound that may be used is copper(II) phthalocyanine, represented by:

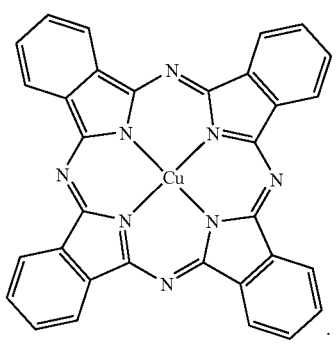

Another hole-transporting compound that may be used is titanyl phthalocyanine, represented by:

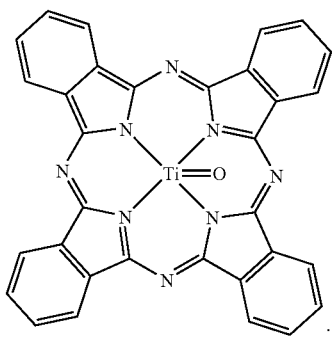

Another hole-transporting compound that may be used is 1,3,5-tris(2-(9-ethylcabazyl-3)ethylene)benzene, represented by:

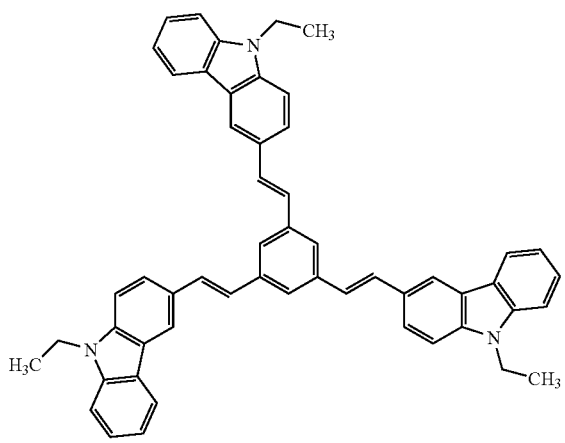 [SMILES: CCn1c2ccccc2c2cc(/C=C/c3cc(/C=C/c4ccc5c(c4)c4ccccc4n5CC)cc(/C=C/c4ccc5c(c4)c4ccccc4n5CC)c3)ccc21]

A hole transport polymer that may be used is poly[(9,9-dihexylfluorenyl-2,7-diyl)-co-(N—N'-bis{p-butylphenyl}-1,4-diamino-phenylene)], sold by American Dye Source, Inc. as ADS250BE, represented by:

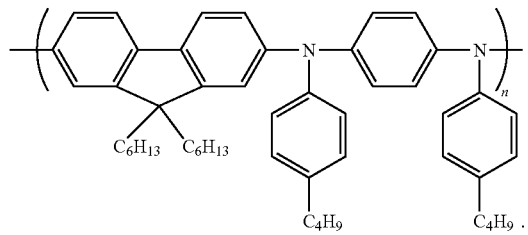

Another hole transport polymer that may be used is poly [(9,9-dioctylfluorenyl-2,7-diyl)-co-(N—N'-bis{4-butylphenyl}-1,1'-byphenylene-4,4-diamine)], represented by:

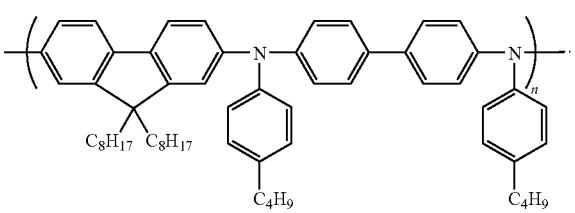

Another hole transport polymer that may be used is poly (N,N'-bis(4-butylphenyl)-N,N'-bis(phenyl)benzedine, represented by:

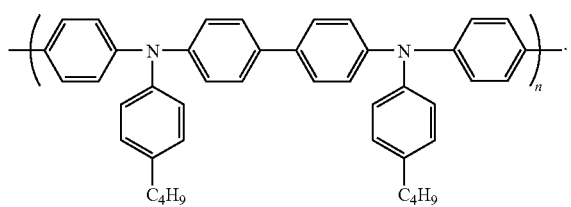

Another hole transport polymer that may be used is poly (copper phthalocyanine), represented by:

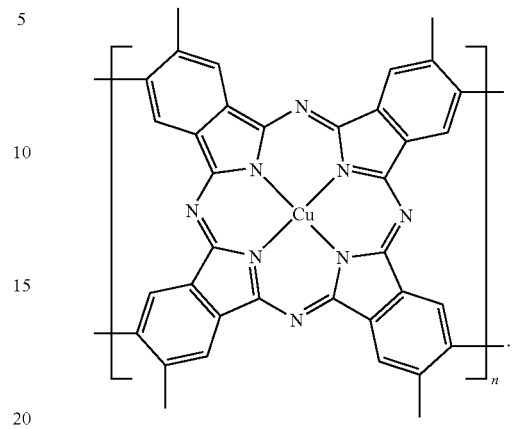

Amounts

In one embodiment, the composition comprises between about 1% and 99% by weight of the conjugated polymer and between about 1% and 99% by weight of the redox dopant. In another embodiment, the composition comprises between about 25 and 99% for the conjugated polymer and between about 1% and 75% of the redox dopant. Typically, the amount by weight of the conjugated polymer is greater than the amount by weight of the redox dopant. The conjugated polymer can be any conjugated polymer as described above. Typically, the repeat unit is a 3,4-disubstituted polythiophene. Typically, the redox dopant can be an iodonium salt in an amount of about 0.01 m/ru to about 1 m/ru, wherein m is the molar amount of iodonium salt and ru is the molar amount of conjugated polymer repeat unit.

In some embodiments, the composition comprises a solvent or a solvent carrier. Typically, in embodiments comprising a solvent or solvent carrier, the composition comprises at least 97 wt % solvent or solvent carrier, and the composition is characterized by a percent solids of 3 wt % or less.

Devices

Various devices can be fabricated in many cases using multilayered structures which can be prepared by, for example, solution or vacuum processing, as well as printing and patterning processes. In particular, use of the embodiments described herein for hole injection layers (HILs), wherein the composition is formulated for use as a hole injection layer, can be carried out effectively. In particular, applications include hole injection layer for OLEDs, PLEDs, PHOLEDs, SMOLEDs, ESDs, photovoltaic cells, supercapacitors, hybrid capacitors, cation transducers, drug release, electrochromics, sensors, FETs, actuators, and membranes. Another application is as an electrode modifier including an electrode modifier for an organic field effect transistor (OFETS). Other applications include those in the field of printed electronics, printed electronics devices, and roll-to-roll production processes. Additionally, the compositions discussed herein may be a coating on an electrode.

For example, photovoltaic devices are known in the art. See for example US Patent Publication 2006/0076050 published Apr. 13, 2006; see also WO 2008/018931 published Feb. 14, 2008, including descriptions of OPV active layers. The devices can comprise, for example, multi-layer structures including for example an anode, including a transparent conductor such as indium tin oxide (ITO) on glass or PET; a hole injection layer and/or a hole transport layer; a P/N bulk heterojunction layer; a conditioning layer such as LiF; and a cathode such as for example Ca, Al, or Ba. The composition can be formulated for use as a hole transport layer. Devices can be adapted to allow for current density versus voltage measurements.

Similarly, OLED devices are known in the art. See for example US Patent Publication 2006/00787661 published Apr. 13, 2006. The devices can comprise, for example, multilayer structures including for example an anode, including a transparent conductor such as ITO on glass or PET or PEN; a hole injection layer; an electroluminescent layer such as a polymer layer; a conditioning layer such as LiF, and a cathode such as for example Ca, Al, or Ba.

Methods known in the art can be used to fabricate devices including for example OLED and OPV devices. Methods known in the art can be used to measure brightness, efficiency, and lifetimes. OLED patents include for example U.S. Pat. Nos. 4,356,429 and 4,539,507 (Kodak). Conducting polymers which emit light are described in for example U.S. Pat. Nos. 5,247,190 and 5,401,827 (Cambridge Display Technologies). See also Kraft et al., "Electroluminescent Conjugated Polymers—Seeing Polymers in a New Light," *Angew. Chem. Int. Ed.,* 1998, 37, 402-428, including device architecture, physical principles, solution processing, multilayering, blends, and materials synthesis and formulation, which is hereby incorporated by reference in its entirety.

Light emitters known in the art and commercially available can be used including various conducting polymers as well as organic molecules, such as materials available from Sumation, Merck Yellow, Merck Blue, American Dye Sources (ADS), Kodak (e.g, AlQ3 and the like), and even Aldrich such as BEHP-PPV. Examples of such organic electroluminescent materials include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) polyp-phenylene and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility; and (xiv) rigid rod polymers such as poly(p-phenylene-2,6-benzobisthiazole), poly(p-phenylene-2,6-benzobisoxazole), polyp-phenylene-2,6-benzimidazole), and their derivatives.

(xv) polyfluorene polymers and co-polymers with polyfluorene units

Preferred organic emissive polymers include SUMATION Light Emitting Polymers ("LEPs") that emit green, red, blue, or white light or their families, copolymers, derivatives, or mixtures thereof; the SUMATION LEPs are available from Sumation KK. Other polymers include polyspirofluorene-like polymers available from Covion Organic Semiconductors GmbH, Frankfurt, Germany (now owned by Merck®).

Alternatively, rather than polymers, small organic molecules that emit by fluorescence or by phosphorescence can serve as the organic electroluminescent layer. Examples of small-molecule organic electroluminescent materials include: (i) tris(8-hydroxyquinolinato)aluminum (Alq); (ii) 1,3-bis(N,N-dimethylaminophenyl)-1,3,4-oxidazole (OXD-8); (iii)-oxo-bis(2-methyl-8-quinolinato)aluminum; (iv) bis (2-methyl-8-hydroxyquinolinato)aluminum; (v) bis(hydroxybenzoquinolinato) beryllium (BeQ.sub.2); (vi) bis (diphenylvinyl)biphenylene (DPVBI); and (vii) arylamine-substituted distyrylarylene (DSA amine).

Such polymer and small-molecule materials are well known in the art and are described in, for example, U.S. Pat. No. 5,047,687 issued to VanSlyke; and Bredas, J.-L., Silbey, R., eds., Conjugated Polymers, Kluwer Academic Press, Dordrecht (1991).

Examples of HIL in devices include:

1) Hole injection in OLEDs including PLEDs and SMOLEDs; for example, for HIL in PLED, all classes of conjugated polymeric emitters where the conjugation involves carbon or silicon atoms can be used. For HIL in SMOLED, the following are examples: SMOLED containing fluorescent emitters; SMOLED containing phosphorescent emitters; SMOLEDs comprising one or more organic layers in addition to the HIL layer; and SMOLEDs where the small molecule layer is processed from solution or aerosol spray or any other processing methodology. In addition, other examples include HIL in dendrimer or oligomeric organic semiconductor based OLEDs; HIL in ambipolar light emitting FET's where the HIL is used to modify charge injection or as an electrode;

2) Hole extraction layer in OPV:

3) Channel material in transistors

4) Channel material in circuits comprising a combination of transistors such as logic gates 5) Electrode material in transistors 6) Gate layer in a capacitor 7) Chemical sensor where modification of doping level is achieved due to association of the species to be sensed with the conductive polymer.

A variety of photoactive layers can be used in OPV devices. Photovoltaic devices can be prepared with photoactive layers comprising fullerene derivatives mixed with for example conducting polymers as described in for example U.S. Pat. No. 5,454,880 (Univ. Cal.); U.S. Pat. Nos. 6,812,399; and 6,933, 436. See also, for example, Wienk et al., *Applied Physics Letters,* 88, 153511 (2006); Campos et al., *Solar Energy Materials & Solar Cells,* 90 (2006) 3531-3546. Also, photoactive layers may comprise blends of conducting polymers, blends of conducting polymers and semiconducting nanoparticles, and bilayers of small molecules such as pthalocyanines, fullerenes, and porphyrins.

Common electrode materials and substrates, as well as encapsulating materials can be used.

A method of making a device typically comprises the steps of providing a substrate; layering a transparent conductor on the substrate; providing an HIL or HTL ink composition comprising a conjugated polymer doped with a photoacid in a solvent as described herein; layering the composition on the transparent conductor to form a hole injection layer or hole transport layer; layering an active layer on the hole injection layer or hole transport layer; and layering a cathode on the active layer.

In another embodiment, a method of making a device comprises applying an HIL or HTL ink composition comprising a conjugated polymer doped with a photoacid in a solvent as described herein as part of an HIL or HTL layer in an OLED, a photovoltaic device, an ESD, a SMOLED, a PLED, a sensor, a supercapacitor, a cation transducer, a drug release device, an electrochromic device, a transistor, a field effect transistor, an electrode modifier, an electrode modifier for an organic field transistor, an actuator, or a transparent electrode.

OLED Measurements

Methods known in the art can be used to measure OLED parameters. For example, measurements can be carried out at 10 mA/cm$^2$.

Voltage can be for example from about 2 to about 15, or about 2 to about 8, or about 2 to 5, or from about 3 to about 14, or from about 3 to about 7.

Brightness can be, for example, at least 250 cd/m$^2$, or at least 500 cd/m$^2$, or at least 750 cd/m$^2$, or at least 1,000 cd/m$^2$.

Efficiency can be, for example, at least 0.25 Cd/A, or at least 0.45 Cd/A, or at least 0.60 Cd/A, or at least 0.70 Cd/A, or at least 1.00 Cd/A, or at least 2.5 Cd/A, or at least 5.00 Cd/A, or at least 7.50 Cd/A, or at least 10.00 Cd/A, or at least 20 Cd/A, or at least 30 Cd/A, or at least 60 Cd/A, or at least 80 Cd/A. An upper limit can be for example about 200 Cd/A.

Lifetime can be measured at 50 mA/cm$^2$ or up to 75 mA/cm$^2$ in hours and can be, for example, at least 50 hours, or at least 100 hours, or at least about 900 hours, or at least 1,000 hours, or at least 1100 hours, or at least 2,000 hours, or at least 5,000 hours, or at least 10,000 h, or at least 20,000 h, or at least 50,000 h. Methods known in the art such as, for example, T50 can be used to measure lifetime.

Combinations of brightness, efficiency, and lifetime can be achieved. For example, brightness can be at least 1,000 cd/m2, efficiency can be at least 1.00 cd/A, and lifetime can be at least 1,000 hours, at least 2,500 hours, or at least 5,000 hours.

Thermal Stability

The undoped and doped polymer compositions can exhibit excellent thermal stability as measured by, for example, thermal gravimetric analysis (TGA). For example, stability can be achieved such that decomposition temperature onset can be at least 100° C., or at least 200° C., or at least 300° C. for doped or undoped forms.

Additional embodiments are provided with a series of non-limiting working examples.

WORKING EXAMPLES

Example 1

Synthetic procedure for
3,4-bis(2-(2-butoxyethoxy)ethoxy)thiophene

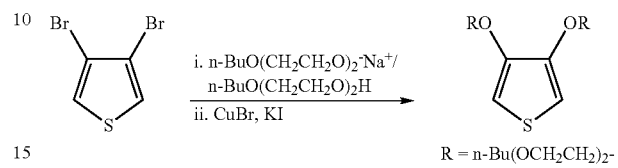

To a dry 1 L three necked round bottom flask with nitrogen purging was added 420 mL butyl carbitol followed by 29 g sodium metal (shavings) to facilitate fast dissolution. The sodium metal was washed with hexanes before addition to the butyl carbitol. The reaction mixture was stirred for approximately 30 to 45 minutes at room temperature. The reaction mixture was then heated to 90° C. to complete the reaction of the metal with the butyl carbitol.

To the mixture, 75 g 3,4-dibromothiophene was added followed by 4.45 g CuBr and 0.51 g KI. The reaction mixture was heated to 90-100° C. for 24 hours. GC-MS of the reaction mixture indicated more than 98% conversion. The reaction mixture was diluted with approximately 500 mL tert-butyl-methyl ether (MTBE). The reaction mixture was then filtered over a 90 cm×1 cm thick silica gel pad. An additional filtration was performed to remove some of the solids found in the reaction mixture, changing the filters if the filtration rate slowed. Filtration was carried out using a 5.0 μm SVPP Durapore® membrane filter. The filtered solution was then concentrated on a rotary evaporator, and the butyl carbitol distilled using a short-path distillation set-up.

GC-MS indicated that the reaction mixture was composed of 87% di-substituted monomer and 12% mono-substituted and de-brominated thiophene and trace amounts of carbitol. The product was purified via silica gel column chromatography eluting with a 60:40 (v/v) mixture of hexanes-ethyl acetate in two lots to obtain an approximately 80 g yield.

Example 2

Dibromination of the
3,4-bis(2-(2-butoxyethoxy)ethoxy)thiophene
monomer

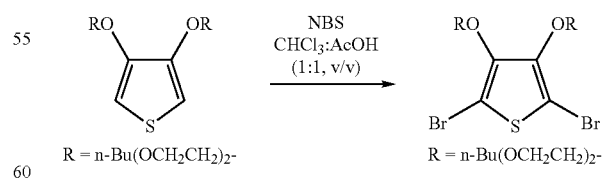

20 g of the 3,4-bis(2-(2-butoxyethoxy)ethoxy)thiophene monomer was dissolved in 90 mL of chloroform. 90 mL of glacial acetic acid was then added to this mixture. The solution was chilled using an ice-bath to approximately 0 to 5° C., and 19.5 g N-bromosuccinimide was added in small portions over 2-3 minutes. The reaction mixture became dark rapidly.

The reaction continued at room temperature for approximately 2 hours and was then neutralized using a dilute sodium bicarbonate solution.

The reaction mixture was transferred to a separation funnel and further diluted with 1 L MTBE. The organic layer was washed with 1×300 mL de-ionized water followed by 2×300 mL 1 M sodium thiosulfate solution. For the thiosulfate wash, the layers were stirred in a beaker for 30 minutes before separating the layers. The organic layer was finally washed with 2×200 mL brine, dried over anhydrous MgSO₄, filtered and concentrated, resulting in a red liquid. The red liquid was purified by passing through a silical gel column with the eluting solvent being 80:20 (v/v) hexanes-ethyl acetate. The combined fractions were concentrated and dried overnight on the Schlenk line to obtain about 22.59 g of an orange-red liquid. The orange-red liquid was taken for polymerization without further purification.

Example 3

Polymerization of 2,5-dibromo-3,4-bis(2-(2-butoxyethoxy)ethoxy)thiophene (I)

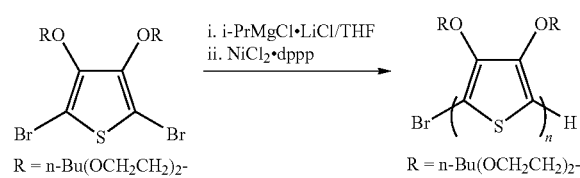

A 1 L three necked round bottom flask was evacuated while being heated and purged with nitrogen thrice. To this flask was added 400 mL of anhydrous tetrahydrofuran (THF) from an MBraun solvent delivery system. 22.59 g of the 2,5-dibromo-3,4-bis(2-(2-butoxyethoxy)ethoxy)thiophene monomer was diluted with approximately 80 mL anhydrous THF and added to the 1 L reaction flask. 20 mL of Anhydrous THF was used to rinse the flask, and the washings were added to the reactor. Next, 36.2 mL of 1.0 M i-PrMgCl.LiCl in THF via syringe was injected into the reaction mixture. The reaction mixture was stirred at room temperature for 45 minutes. 0.22 g NiCl₂.dppp suspended in 6 mL anhydrous were added in THF via syringe. The reaction mixture became opaque and magenta colored in a few minutes.

The reaction mixture was refluxed overnight and then added into 4 L ethanol. The reaction mixture was concentrated by removing 90% or more of the solvents. Approximately 1 L of water was added, a sufficient amount to cause the polymer to precipitate. The precipitate was filtered using a 5.0 μm SVPP Durapore® membrane filter. The polymer was dark purple in color and was subsequently stirred with gentle heating to raise the temperature to about 50 to 70° C. in each of the following solvents as specified. In each case, the solvents were mixed prior to adding the polymer to the solvent.
  1×135 mL Concentrated HCl+100 mL ethanol+265 mL de-ionized water
  1×135 mL Concentrated HCl+150 mL ethanol+215 mL de-ionized water
  1×150 mL ethanol+150 mL de-ionized water
After each wash step above, the polymer was washed with approximately 500 mL de-ionized water.
  1×3.8 g EDTA, tetrasodium salt 200 mL de-ionized water+ 50 mL ethanol (EDTA-4Na was dissolved in water and then the ethanol was added to the solution).

After the EDTA treatment the polymer was washed with de-ionized water followed by ethanol until the filtrate was colorless.
  1×40 mL ethanol+160 mL de-ionized water
  1×25 mL hydrazine (35 wt % in water)+80 mL ethanol+95 mL de-ionized water at room temperature.

The hydrazine treated polymer was filtered and washed with 500 mL de-ionized water and 100 mL ethanol. Filtration was carried out using a 5.0 μm SVPP Durapore® membrane filter. 50 mL ethanol+150 mL de-ionized water was then stirred into the mixture with heating for 1 hour. The polymer was filtered and washed again with 500 mL de-ionized water followed by 5×50 mL ethanol, and then suction dried over the funnel and finally in a vacuum oven at 55° C. for 24 hrs. Filtration was carried out using a 5.0 μm SVPP Durapore® membrane filter. About 11 g (68%) of polymer were collected and stored in a glove-box for further use. End-group analysis by measuring bromine content (0.175%) in the polymer via Inductively Coupled Plasma (ICP) indicated a DPn of 114.

It can be estimated that all of the Br measured is from the chain-end of the polymer. Based on the nature of polymerization mechanism as known, it can be understood that the polymer is capped on one end with Br and on the other end with a H, unless and until treated for de-bromination.

¹H-NMR, CDCl₃ (δ ppm, (# H's)): 4.3 (4H), 3.9 (4H), 3.7 (4H), 3.55 (4H), 3.45 (4H), 1.55 (4H), 1.3 (4H), 0.9 (6H). Thermogravimetric analysis indicated a decomposition temperature onset of 319° C. A broad crystalline melting endotherm with a peak at 159° C. was observed in the differential scanning calorimetry of the polymer. TA Instruments TGA-Q500 can be used to measure TGA properties, and TA Instruments DSC-Q200 can be used to measure DSC properties. Scan rate can 20° C./min.

Example 4

Polymerization of 2,5-dibromo-3,4-bis(2-(2-butoxyethoxy)ethoxy)thiophene (II) (P3DBEETh)

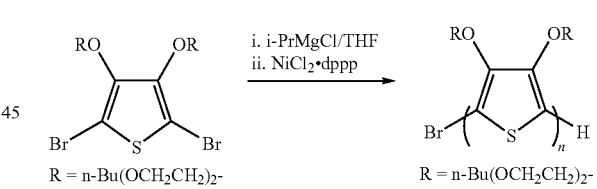

A 2 L three necked round bottom flask was flame dried under vacuum and purged with nitrogen (repeated thrice). To this flask was added 44.98 g of 2,5-dibromo-3,4-bis(2-(2-butoxyethoxy)ethoxy)thiophene (II) monomer. The flask in which the monomer was stored was rinsed 2 times with 10 mL anhydrous THF, and the washings were added to the reactor. 680 mL of anhydrous THF from an MBraun solvent delivery system was transferred via cannula. 97 mL of 0.79 M i-PrMgCl in THF was injected via syringe. The reaction mixture stirred at room temperature for 45 minutes. 0.275 g NiCl₂.dppp suspended in 6 mL anhydrous THF was added via syringe. The reaction mixture was refluxed overnight and precipitated into 7 L ethanol.

The polymer was filtered and stirred in ethanol overnight (total volume, 2 L). Filtration was carried out using a 5.0 μm SVPP Durapore® membrane filter. The polymer was then filtered and washed with 500 mL ethanol. The polymer was subsequently stirred with gentle heating to a temperature of about approximately 50 to 70° C. in the following solvents as specified. In all cases, the solvents were mixed prior to adding the polymer to the solvent.

1×100 mL Conc. HCl+1300 mL de-ionized water
1×100 mL Conc. HCl+200 mL ethanol+700 mL de-ionized water
1×50 mL ethanol+450 mL de-ionized water.
1×5 g EDTA-4Na+100 mL ethanol+900 mL de-ionized water (EDTA-4Na was dissolved in water and then the ethanol was added to the solution).

After each wash step above the polymer was washed with approximately 500 mL de-ionized water.

1×50 mL ethanol+450 mL de-ionized water

The polymer was filtered and washed with 500 mL de-ionized water, followed by ethanol until the filtrate was colorless. Filtration was carried out using a 5.0 μm SVPP Durapore® membrane filter.

After the final filtration step, the polymer was suction dried on the funnel and then in a vacuum oven at 50° C. for 48 hrs. About 21 g (65%) of polymer were obtained and were stored in a glove-box for further use. End-group analysis by measuring bromine content (0.196%) in the polymer via Inductively Coupled Plasma (ICP) indicated a DPn of 102.

It can be assumed that all of the Br measured is from the chain-end of the polymer. Based on the nature of polymerization mechanism as known, it can be understood that the polymer is capped on one end with Br and on the other end with a H, unless and until treated for de-bromination.

Example 5

Formulations Containing P3DBEETh and Dopants (HIL Inks or HIL Formulations)

Unless otherwise indicated, preparation of stock solution and mixing the solutions were all performed in the glove-box.

Stock solutions of P3DBEETh and IMDPIB(PhF$_5$)$_4$ (from TCI America) were prepared as in Examples 3 and 4. Stock solutions of tris(4-bromophenyl) aminium hexachloroantimonate. (TBPAH) (from Aldrich) were similarly prepared. The P3DBEETh solutions were sonicated for 30 minutes.

The dopant (IMDPIB(PhF$_5$)$_4$ was readily soluble in a variety of solvents. The dopant TBPAH was dissolved in acetonitrile. The polymer was dissolved in toluene/acetonitrile-toluene mixture. The dopant was then added to the polymer solution, and the solvent composition adjusted by adding solvent 1 or 2 appropriately.

Table 1 lists the compositions prepared. For formulations 1-12, the dopant solution and P3DBEETh solution were each made up to be 0.5% solids. For formulations 13-15, the solutions were each made up to be 1% solids. For formulation 16, the solutions were each made up to be 3% solids. And for the remaining formulations, the solutions were each made up to be 2% solids.

To obtain the compositions listed in Table 1, the dopant solution was added to the P3DBEETh solution and refluxed in a nitrogen purged 100 mL 1 necked round bottom flask for 2 hours with a N$_2$ blanket unless otherwise indicated. However, not all of the formulations in Table 1 were heated, as reported in Table 1. The solutions were cooled to room temperature, transferred to a vial and stored in the glove-box.

Also, formulations 7-9 have been made at higher % solids (e.g., 1.5) and diluted after the reflux treatment. Coatings of above formulations were obtained by filtering the solution through a 0.45 mm syringe filter onto a glass plate and spinning in a glove-box. Annealing of the films were also performed inside the glove-box. Transmittance of a 42 nm thick film of doped poly(3,4-bis(2-(2-butoxyethoxy)ethoxy) thiophene) annealed at 130° C. for 15 minutes indicates that it has a % T≥85% in the visible region.

TABLE 1

| | Solvent 1 | | Solvent 2 | | PDBEETh | Dopant | | Heating | |
|---|---|---|---|---|---|---|---|---|---|
| HIL # | Identity | wt % | Identity | wt % | wt % | Identity | wt % | Temp. (° C.) | Time (h) |
| 1 | CHCl$_3$ | 99.5 | — | — | 0.500 | — | — | — | — |
| 2 | CHCl$_3$ | 99.5 | — | — | 0.399 | IMDPIB(PhF$_5$)$_4$ | 0.101 | — | — |
| 3 | CHCl$_3$ | 99.5 | — | — | 0.332 | IMDPIB(PhF$_5$)$_4$ | 0.168 | — | — |
| 4 | CHCl$_3$ | 99.5 | — | — | 0.285 | IMDPIB(PhF$_5$)$_4$ | 0.215 | — | — |
| 5 | CHCl$_3$ | 99.5 | — | — | 0.221 | IMDPIB(PhF$_5$)$_4$ | 0.279 | — | — |
| 6 | CHCl$_3$ | 99.5 | — | — | 0.181 | IMDPIB(PhF$_5$)$_4$ | 0.319 | — | — |
| 7 | CHCl$_3$ | 99.5 | — | — | 0.332 | IMDPIB(PhF$_5$)$_4$ | 0.168 | Reflux | 2 |
| 8 | CHCl$_3$ | 99.5 | — | — | 0.307 | IMDPIB(PhF$_5$)$_4$ | 0.193 | Reflux | 2 |
| 9 | CHCl$_3$ | 99.5 | — | — | 0.285 | IMDPIB(PhF$_5$)$_4$ | 0.215 | Reflux | 2 |
| 10 | Toluene | 73.5 | NMP | 24.5 | 1.138 | IMDPIB(PhF$_5$)$_4$ | 0.862 | 60° C. | 2 |
| 11 | Toluene | 73.5 | NMP | 24.5 | 1.138 | IMDPIB(PhF$_5$)$_4$ | 0.862 | 90° C. | 2 |
| 12 | Toluene | 73.5 | NMP | 24.5 | 1.138 | IMDPIB(PhF$_5$)$_4$ | 0.862 | 110° C. | 2 |
| 13 | Toluene | 74.24 | Acetonitrile | 24.75 | 0.660 | IMDPIB(PhF$_5$)$_4$ | 0.340 | — | — |
| 14 | Toluene | 74.25 | Acetonitrile | 24.75 | 0.610 | IMDPIB(PhF$_5$)$_4$ | 0.390 | — | — |
| 15 | Toluene | 74.25 | Acetonitrile | 24.75 | 0.570 | IMDPIB(PhF$_5$)$_4$ | 0.430 | — | — |
| 16 | Toluene | 72.75 | Acetonitrile | 24.25 | 1.702 | IMDPIB(PhF$_5$)$_4$ | 1.298 | — | — |
| 17 | Anisole | 98 | — | — | 1.448 | IMDPIB(PhF$_5$)$_4$ | 0.552 | — | — |
| 18 | Anisole | 98 | — | — | 1.33 | IMDPIB(PhF$_5$)$_4$ | 0.67 | — | — |
| 19 | Anisole | 98 | — | — | 1.22 | IMDPIB(PhF$_5$)$_4$ | 0.78 | — | — |
| 20 | Anisole | 98 | — | — | 1.14 | IMDPIB(PhF$_5$)$_4$ | 0.87 | — | — |
| 21 | Anisole | 98 | — | — | 0.992 | IMDPIB(PhF$_5$)$_4$ | 1.008 | — | — |
| 22 | 1,2-Dimethoxyethane | 98 | — | — | 1.33 | IMDPIB(PhF$_5$)$_4$ | 0.67 | — | — |
| 23 | 1,2-Dimethoxyethane | 98 | — | — | 1.22 | IMDPIB(PhF$_5$)$_4$ | 0.78 | — | — |

TABLE 1-continued

| HIL # | Solvent 1 Identity | wt % | Solvent 2 Identity | wt % | PDBEETh wt % | Dopant Identity | wt % | Heating Temp. (° C.) | Time (h) |
|---|---|---|---|---|---|---|---|---|---|
| 24 | 1,2-Dimethoxyethane | 98 | — | — | 1.14 | IMDPIB(PhF$_5$)$_4$ | 0.87 | — | — |
| 25 | Toluene | 73.5 | Acetonitrile | 24.5 | 1.42 | TBPAH | 0.58 | — | — |
| 26 | Toluene | 73.5 | Acetonitrile | 24.5 | 1.24 | TBPAH | 0.76 | — | — |
| 27 | Anisole | 73.5 | Acetonitrile | 24.5 | 1.42 | TBPAH | 0.58 | — | — |
| 28 | Anisole | 73.5 | Acetonitrile | 24.5 | 1.324 | TBPAH | 0.676 | — | — |
| 29 | Anisole | 73.5 | Acetonitrile | 24.5 | 1.24 | TBPAH | 0.76 | — | — |
| 30 | 1,2-Dimethoxyethane | 73.5 | Acetonitrile | 24.5 | 1.42 | TBPAH | 0.58 | — | — |
| 31 | 1,2-Dimethoxyethane | 73.5 | Acetonitrile | 24.5 | 1.324 | TBPAH | 0.676 | — | — |
| 32 | 1,2-Dimethoxyethane | 73.5 | Acetonitrile | 24.5 | 1.24 | TBPAH | 0.76 | — | — |

Example 6

Spectroscopic Evidence for Doping

FIG. 1 illustrates a UV-vis-NIR spectra of films of poly(3,4-bis(2-(2-butoxyethoxy)ethoxy)thiophene) doped with of IMDPIB(PhF$_5$)$_4$ and spun from chloroform. The solid line shows the UV-vis-NIR spectra of a refluxed formulation. The dashed line shows the UV-vis-NIR spectra of a freshly prepared formulation. The dotted line shows the UV-vis-NIR spectra of the neutral polymer. Aging the sample at room temperature gives similar results like the refluxed sample. All samples were annealed at 130° C. for 15 min in the glove-box.

Figure 2:
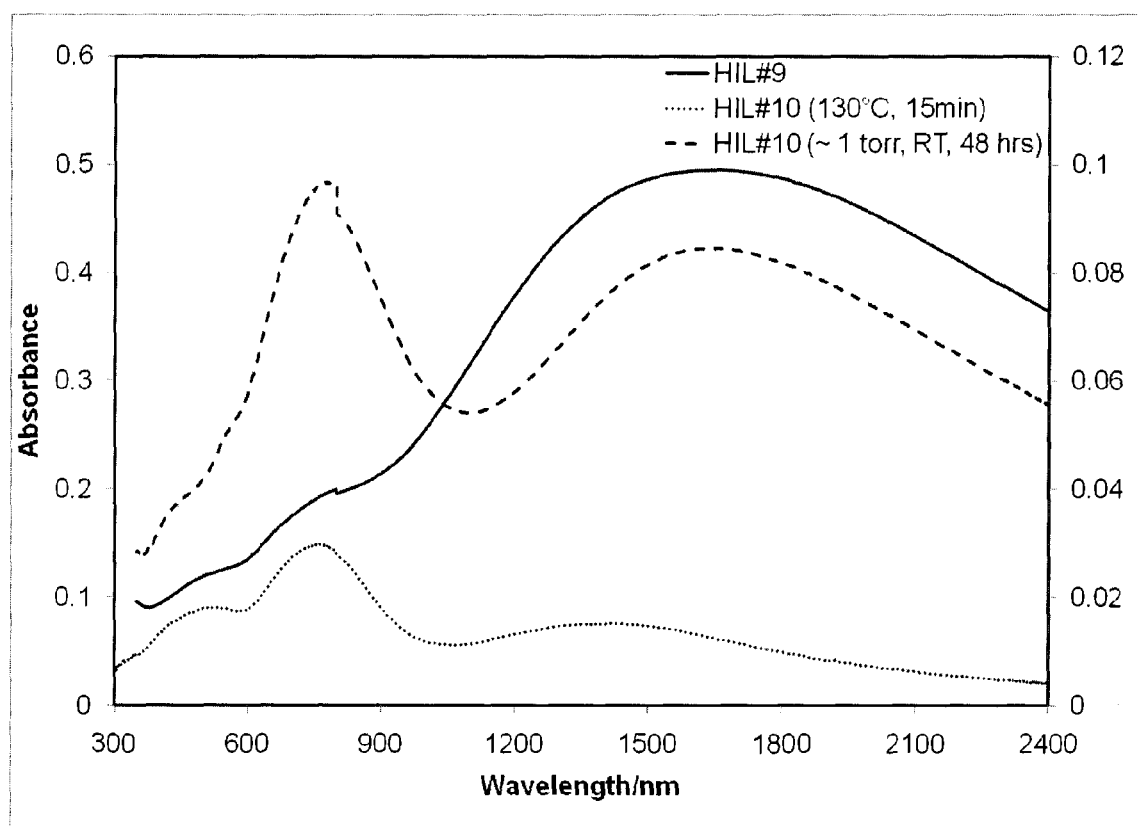
FIG. 2 illustrates a UV-vis-NIR spectra of films poly(3,4-bis(2-(2-butoxyethoxy)ethoxy)thiophene) doped with of IMDPIB(PhF$_5$)$_4$ in different solvent systems and at different annealing conditions.

FIG. 2 illustrates a UV-vis-NIR spectra of films poly(3,4-bis(2-(2-butoxyethoxy)ethoxy)thiophene) doped with of IMDPIB(PhF$_5$)$_4$ in different solvent systems and at different annealing conditions. The solid line shows the UV-vis-NIR spectra of formulations spun from chloroform. The films represented by the dashed line used a 1:3 (wt/wt) NMP-toluene mixture and were annealed in vacuo at room temperature for 48 hours. The films represented by the dotted line used a 1:3 (wt/wt) NMP-toluene mixture and were annealed in the glove-box for 15 minutes.

Example 7

OLED Device Fabrication

The OLED devices described herein were fabricated on indium tin oxide (ITO) surfaces deposited on glass substrates. The ITO surface was pre-patterned to define the pixel area of 0.05 cm$^2$. The device substrates were cleaned by ultrasonication in a dilute soap solution for 20 minutes each followed by distilled water washes. This was followed by ultrasonication in isopropanol for 20 minutes. The substrates were dried under nitrogen flow, following which they were treated in a UV-Ozone chamber operating at 300 W for 20 minutes.

The cleaned substrates were then coated with an HIL ink and dried at 90-170° C. for 5-15 minutes to form an HIL layer. Dry film thicknesses ranged from approximately 20 nm to 60 nm. The coating process was done on a spin coater but can be similarly achieved with spray coating, ink-jetting, contact printing or any other deposition method capable of resulting in an HIL film of the desired thickness. The substrates were then transferred to a vacuum chamber where the remaining layers of the device stack were deposited by means of physical vapor deposition.

In one example, the layers deposited on top of the HIL include a hole transporting layer (HTL), an emissive layer (EML), a hole blocking layer (HBL), an electron transporting layer (ETL), and a metal cathode. The materials used in this example were N,N'(di naphthalen-1-yl)-N,N'-diphenyl-benzidine (NPB) as the HTL, Bis(2-methyl-8-quinolinolato-N1,O8)-(1,1'-Biphenyl-4-olato)aluminum (BAlq) doped with Tris-(1-phenylisoquinoline) iridium 111 (Ir(piq)$_3$) for the EML, BAlq as the HBL, and tris(8-hydroxyquinoline)aluminium (Alq3) as the ETL All of these materials are commercially available and typically found in OLED structures in the art.

Also in this example, the cathode layer was prepared by the sequential deposition of two metal layers, the first being a 3 nm to 5 nm layer of Ca (0.1 nm/sec) followed by a 200 nm layer of Al (0.5 nm/sec) with the base pressure at 5×10$^{-7}$ Torr.

In another example, the materials that were deposited onto the HIL were a hole transporting layer (HTL) and an emissive layer (EML). In this example the HTL was N,N'(di naphthalen-1-yl)-N,N'-diphenyl-benzidine (NPB) and the EML was tris(8-hydroxyquinoline)aluminium (Alq3). Again, the cathode layer was prepared by the sequential deposition of two metal layers, the first being a 3 nm to 5 nm layer of Ca (0.1 nm/sec) followed by a 200 nm layer of Al (0.5 nm/sec) with the base pressure at 5×10$^{-7}$ Torr.

The devices thus obtained were encapsulated with a glass cover slip to prevent exposure to ambient conditions by means of a UV-light curing epoxy resin cured at 80 W/cm$^2$ UV exposure for 4 minutes.

Example 8

OLED Testing

The OLEDs comprise pixels on a glass substrate whose electrodes extended outside the encapsulated area of the device which contain the light emitting portion of the pixels. The typical area of each pixel is 0.05 cm². The electrodes were contacted with a current source meter such as a Keithley 2400 source meter with a bias applied to the indium tin oxide electrode while the aluminum electrode was earthed. This results in positively charged carriers (holes) and negatively charged carriers being injected into the device which form excitons and generate light. In this example, the HIL assists the injection of charge carriers into the light emitting layer. This results in a low operating voltage of the device (defined as the voltage required to run a given current density through the pixel).

Simultaneously, another Keithley 2400 source meter was used to address a large area silicon photodiode. This photodiode was maintained at zero volts bias by the 2400 source meter. It is placed in direct contact with area of the glass substrate directly below the lighted area of the OLED pixel. The photodiode collected the light generated by the OLED converting them into photocurrent which is in turn read by the source meter. The photodiode current generated is quantified into optical units (candelas/sq. meter) by calibrating it with the help of a Minolta CS-200 Chromameter.

During the testing of the device, the Keithley 2400 addressing the OLED pixel applied a voltage sweep to it. The resultant current passing through the pixel was measured. At the same time the current passing through the OLED pixel results in light being generated which then results in a photocurrent reading by the other Keithley 2400 connected to the photodiode. Thus the voltage-current-light or IVL data for the pixel was generated. This in turn enables the measurement of other device characteristics such as the lumens per Watt of electrical input power to the pixel and candelas per ampere of pixel current.

The performance of different HILs in different example OLED types is described. Note that typically performance is quantified by a combination of different parameters such as operating voltage (should be low), brightness in nits (should be bright, luminous efficiency in units of cd/A (reflecting how much electric charge is needed to obtain light from the device) and the lifetime under operation (time required to reach half of the initial luminance value at the start of the test). As such, the overall performance is very important in a comparative evaluation of HIL performance.

In this particular example, one advantage was an improvement in lifetime in devices with phosphorescent emitters.

A comparative example ink (Formula A) was prepared according to the formulation in Table 2:

TABLE 2

| Material | Wt % |
| --- | --- |
| P3MEET-S | 0.13 |
| Poly(4-vinylphenol) | 1.94 |
| Poly(styrenesulfonic acid) | 0.07 |
| Nafion | 0.07 |
| Water | 53.79 |
| Butyl Cellosolve | 44.01 |

P3MEET-S is a sulfonated polythiophene comprising 3-substituted alkoxy groups (see, for example, U.S. patent application Ser. No. 11/826,394 filed Jul. 13, 2007, now US publication 2008/0248313).

Table 3 below provides efficiency results for device structures with the inventive HIL 9 formulated with chloroform and a comparative, aqueous HIL as shown in Table 2, Formula A.

Table 4 below provides the lifetime improvements for devices made with the inventive HIL vs. the comparative HIL. The lifetimes are evaluated by comparing the times at which the device brightness reached 50% of its initial value (called T50 or t50). In this example, HIL 9 was annealed at 150° C. for about 20 minutes.

TABLE 3

| HIL System | Device structure | Current Density (mA/cm²) | Voltage (V) | Brightness (cd/m²) |
| --- | --- | --- | --- | --- |
| Comparative HIL (Formula A) | ITO/HIL/NPB/BAlq: Ir(piq)3/BAlq/Alq3/Ca/Al | 10 | 9.5 | 240 |
| HIL 9 | | 10 | 9.4 | 260 |

TABLE 4

| HIL System | Device structure | Current Density (mA/cm²) | Initial Brightness (cd/m²) | Lifetime @ t50 (hrs) |
| --- | --- | --- | --- | --- |
| Comparative HIL (Formula A) | ITO/HIL/NPB/BAlq: Ir(piq)3/BAlq/Alq3/Ca/Al | 27 | 1000 | 160 |
| HIL 9 | | 22 | 1000 | 1400 |

From Table 3 and Table 4, it is shown that the inventive HIL results in similar device efficiencies as the comparative HIL in this device structure. Devices made with the inventive HIL result in lifetimes that are seven times longer than devices made with the comparative HIL. The data further means that long lifetimes in phosphorescent OLED devices may require the use of non-aqueous HILs, such as HIL 9.

Varying the concentrations of components in the inventive HIL and varying the effect of HIL annealing temperature and annealing time are important parameters to control in order to improve device efficiency and device lifetime. Table 5 shows data for devices made with structures ITO/HIL/NPB/Alq3/Ca/Al that have different concentrations of photoacid in the inventive HIL which is made with chloroform. The annealing was carried out at 150° C. for 20 min. As the concentration of photoacid in the device increases, the device efficiency can be improved. In one embodiment, the concentration of photoacid in formulations of this invention is 0.3 mol/ru.

TABLE 5

| HIL system | Concentration of Photoacid (mol/repeat unit) | Device structure | Voltage (V) at 10 mA/cm$^2$ | Brightness (cd/m$^2$) at 10 mA/cm$^2$ | Efficiency (lm/W) at 10 mA/cm$^2$ |
|---|---|---|---|---|---|
| HIL 1 | 0 (run 1) | ITO/HIL/NPB/Alq3/Ca/Al | 14.7 | 104 | 0.25 |
| HIL 2 | 0.1 (run 1) | | 9.3 | 390 | 1.4 |
| HIL 3 | 0.2 (run 1) | | 7.8 | 450 | 1.7 |
| HIL 4 | 0.3 (run 2) | | 4.85 | 310 | 2 |
| HIL 5 | 0.5 (run 2) | | 5.4 | 285 | 1.67 |
| HIL 6 | 0.7 (run 2) | | 5.8 | 286 | 1.6 |

Run 1 and run 2 refer to the different experimental runs in which these devices were tested. While there is some run to run variation up to about 0.5V, the trends seen for the concentration of photoacid in the HIL are the same.

Table 6 shows devices that use 0.3 mol/ru photoacid concentration can be further improved by controlling the annealing time and annealing temperature. The annealing in this case was done in a glove box on a hotplate after the solution was cast using a spin coating method. Film thicknesses were between approximately 20 and 30 nm. As seen in Table 6, as annealing time and temperature increase, the device lifetime improved.

TABLE 6

| HIL System | Device structure | Annealing Temperature (° C.) | Annealing time | Current Density (mA/cm$^2$) for lifetime testing | Initial Brightness (cd/m$^2$) | Lifetime (hrs) at t50 |
|---|---|---|---|---|---|---|
| HIL 9 | ITO/HIL/NPB/Alq3/Ca/Al | 90 | 5 | 23.3 | 1000 | 7 |
| | | 90 | 30 | 16.7 | 1000 | 10 |
| | | 130 | 5 | 18.9 | 1000 | 40 |
| | | 130 | 30 | 20 | 1000 | 250 |

Example 9

Transparency

In this example, it was demonstrated that the transparency of the inventive HIL is at least 85% from about 350 nm to about 800 nm. The doped HIL films exhibit little or no peaks in the visible region and behave like a neutral density filter. The films were annealed in glove box at 130° C. for 15 min.

Example 10

Different Photoacids Used in HIL Formulation with the P3DBEETh Polymer

Several different HILs comprising chloroform as a solvent and a mixture of different photoacids with the P3DBEETh polymer were investigated in bilayer, small molecule OLED devices. The formulations are given in Table 7.

TABLE 7

| HIL # | CHCl$_3$, wt % | PDBEETh, wt % | Photoacid | Photoacid, wt % |
|---|---|---|---|---|
| 13 | 99.5 | 0.413 | DPIPF$_6$ | 0.087 |
| 14 | 99.5 | 0.379 | DPIPF$_6$ | 0.121 |
| 15 | 99.5 | 0.388 | DPIPFBSO$_3$ | 0.112 |
| 16 | 99.5 | 0.349 | DPIPFBSO$_3$ | 0.151 |
| 17 | 99.5 | 0.356 | tBDPITFSO$_3$ | 0.144 |
| 18 | 74.79 | 0.374 | DPITos | 0.126 |

These devices contained a hole transporting layer (HTL) of NPB and an emissive layer (EML) of Alq3. The devices had the following structure: ITO/HIL/NPB/Alq3/Ca/Al. The optimum device performance was achieved using an HIL of the IMDPIBF$_5$Ph$_4$ photoacid mixed with the P3DBEETh polymer. The photoacid was dissolved in 24.6% DMF as a co-solvent and added to the polymer solution. All formulations were mixed at room temperature and used the next day after being stored in glove-box at room temperature. The best device performance was judged as the device with the lowest voltage and highest brightness at a given current density (in this case 10 mA/cm$^2$). The best device performance was obtained with the IMDPIB(PhF$_5$)$_4$ polymer. Percentages indicated are weight percentages. The results are illustrated in Table 8.

TABLE 8

| HIL # | Current Density (mA/cm$^2$) | Voltage (V) | Brightness (cd/m$^2$) |
|---|---|---|---|
| 4 | 10 | 4.85 | 310 |
| 13 | 10 | 10.1 | 100 |
| 14 | 10 | 9 | 77 |
| 15 | 10 | 6 | 20 |
| 16 | 10 | 6.4 | 33 |

Example 11

Wash Study Lifetime

For HIL 9 (1024 with P3DBEETh and borate salt photoacid), devices were made to determine the intractability of the HIL film. The data below shows devices with the structure ITO/HIL/NPB/Apq3/Ca/Al. HILs for the first three devices were cast using the spin coating method and were then annealed on a hot plate at the given temperature. The HILs for the last three devices were spin cast, annealed, then washed with toluene. The solvent was dropped on top of the HIL and then the substrate was rotated at 700 rpm for 40 seconds and was then annealed at 175 C for 15 min.

The wash step with toluene did not hinder the device performance or device lifetime.

Additional Embodiments

Finally, U.S. provisional filing 61/044,380 filed Apr. 11, 2009 and U.S. provisional filing 61/119,239 filed Dec. 2, 2008 describe the following 121 embodiments:

A first embodiment ("embodiment one") comprises a composition comprising at least one conjugated polymer mixed with at least one redox dopant.

An additional embodiment comprises the composition of embodiment 1, wherein the conjugated polymer comprises a polythiophene backbone.

An additional embodiment comprises the composition of embodiment 1, wherein the conjugated polymer is a 3,4-disubstituted polythiophene.

An additional embodiment comprises the composition of embodiment 1, wherein the conjugated polymer is a poly(3,4-dialkoxythiophene).

An additional embodiment comprises the composition of embodiment 1, wherein the conjugated polymer is represented by:

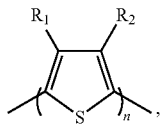

wherein independently $R_1$ is an alkoxy moiety, an optionally substituted alkyl, an optionally substituted aryloxy, an optionally substituted alkylene oxide, an optionally substituted ethylene oxide, or an optionally substituted propylene oxide; and independently $R_2$ is an alkoxy moiety, an optionally substituted alkyl, an optionally substituted aryloxy, an optionally substituted alkylene oxide, an optionally substituted ethylene oxide, or an optionally substituted propylene oxide.

An additional embodiment comprises the composition of embodiment 1, wherein the conjugated polymer is represented by

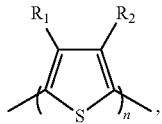

wherein independently $R_1$ is an alkoxyalkoxyalkoxy moiety, and independently $R_2$ is an alkoxyalkoxyalkoxy moiety.

An additional embodiment comprises the composition of embodiment 1, wherein the conjugated polymer is poly(3,4-bis(2-(2-butoxyethoxy)ethoxy)thiophene)-2,5-diyl.

An additional embodiment comprises the composition of embodiment 1, wherein the redox dopant is a quinone, a borane, a carbocation, a bora-tetraazapentalene, an aminium or ammonilium salt, a sulfonium salt, an oxonium salt, a selenonoium salt, a nitrosonium salt, an arsonium salt, a phosphonium salt, an iodonium salt, a metal salt, or combinations thereof.

An additional embodiment comprises the composition of embodiment 1, wherein the redox dopant is a diphenyliodonium salt, and wherein the phenyl rings of the diphenyliodonium salt are optionally substituted.

An additional embodiment comprises the composition of embodiment 1, wherein the redox dopant comprises an anion, wherein the anion is a chloride anion, a bromide anion, an iodide anion, a tetrafluoroborate anion, a hexafluorophosphate anion, an optionally substituted arylsulfonate anion, an optionally substituted alkylsulfonate anion, a perfluoroalkylsulfonate anion, an optionally substituted tetraarylborate anion, an optionally substituted tetraalkylborate anion, or combinations thereof.

An additional embodiment comprises the composition of embodiment 1, wherein the redox dopant comprises a diphenyliodonium salt comprising an anion, wherein the anion is a chloride anion, a bromide anion, an iodide anion, a tetrafluoroborate anion, a hexafluorophosphate anion, an optionally substituted arylsulfonate anion, an optionally substituted alkylsulfonate anion, a perfluoroalkylsulfonate anion, an optionally substituted tetraarylborate anion, an optionally substituted tetraalkylborate anion, or combinations thereof.

An additional embodiment comprises the composition of embodiment 1, wherein the composition further comprises a synthetic polymer different from the conjugated polymer.

An additional embodiment comprises the composition of embodiment 1, wherein the composition further comprises a synthetic polymer different from the conjugated polymer, and the synthetic polymer has a glass transition temperature of greater than 25° C.

An additional embodiment comprises the composition of embodiment 1, wherein the composition further comprises a planarizing agent.

An additional embodiment comprises the composition of embodiment 1, wherein the composition further comprises a planarizing agent, wherein the planarizing agent comprises poly(styrene), poly(styrene) derivatives, poly(vinyl acetate), poly(vinyl acetate) derivatives, poly(ethylene glycol), poly(ethylene glycol) derivatives, poly(ethylene-co-vinyl acetate), poly(pyrrolidone), poly(aryl ether ketones), poly(aryl sulfones), poly(aryl ether sulfones), poly(esters), or combinations thereof.

An additional embodiment comprises the composition of embodiment 1, wherein the composition further comprises a planarizing agent, wherein the planarizing agent comprises a polymer comprising optionally substituted fused aromatic rings or optionally substituted polycyclic aromatic hydrocarbon side groups.

An additional embodiment comprises the composition of embodiment 1, wherein the composition comprises about 25 wt. % to about 99 wt. % conjugated polymer and about 1 wt. % to about 75 wt. % redox dopant, wherein wt. % is with respect to the total amount of conjugated polymer and the redox dopant.

An additional embodiment comprises the composition of embodiment 1, wherein the amount of redox dopant is about 0.01 m/ru to about 1 m/ru, wherein m is the molar amount of the redox dopant and ru is the molar amount of conjugated polymer repeat unit.

An additional embodiment comprises the composition of embodiment 1 wherein the conjugated polymer is soluble in tetrahydrofuran, chloroform, alkylated benzenes, halogenated benzenes, NMP, DMF, DMAc, DMSO, methyl ethyl ketone, cyclohexanone, chloroform, dichloromethane, acetone, THF, dioxanes, ethyl acetate, ethyl benzoate, ethylene carbonate, or propylene carbonate.

An additional embodiment comprises the composition of embodiment 1 further comprising an organic solvent.

An additional embodiment comprises the composition of embodiment 1 further comprising an aprotic organic solvent.

An additional embodiment comprises the composition of embodiment 1 further comprising an organic solvent, wherein the organic solvent is tetrahydrofuran, chloroform, alkylated benzenes, halogenated benzenes, NMP, DMF, DMAc, DMSO, methyl ethyl ketone, cyclohexanone, chloroform, dichloromethane, acetone, THF, dioxanes, ethyl acetate, ethyl benzoate, ethylene carbonate, propylene carbonate, or combinations thereof.

An additional embodiment comprises the composition of embodiment 1, wherein the composition is formulated for use as a hole injection or hole transport layer in an organic electronic device.

An additional embodiment comprises the composition of embodiment 1, wherein the composition is heated after mixing the conjugated polymer and redox dopant.

An additional embodiment comprises the composition of embodiment 1, wherein the dopant comprises an anion which comprises fluorine, and the composition is substantially free of any additional perfluorinated material.

An additional embodiment comprises the composition of embodiment 1, wherein the composition is a film coated on a substrate, and the film is intractable to an organic solvent.

An additional embodiment comprises the composition of embodiment 1, wherein the composition is a film coated on a substrate, and the film is intractable to toluene.

An additional embodiment comprises the composition of embodiment 1, wherein the conjugated polymer comprises a polythiophene backbone and the redox dopant is a diaryl iodonium salt.

An additional embodiment comprises the composition of embodiment 1, wherein the conjugated polymer is a poly(3,4-dialkoxythiophene) and the redox dopant is a diphenyl iodonium salt.

An additional embodiment comprises the composition of embodiment 1, further comprising a hole-transporting compound, wherein the hole-transporting compound is a small molecule or a hole-transporting polymer.

An additional embodiment ("embodiment 31") comprises a composition comprising at least one conjugated polymer mixed with at least photoacid.

An additional embodiment comprises the composition of embodiment 31, wherein the conjugated polymer comprises a polythiophene backbone.

An additional embodiment comprises the composition of embodiment 31, wherein the conjugated polymer is a 3,4-disubstituted polythiophene.

An additional embodiment comprises the composition of embodiment 31, wherein the conjugated polymer is a poly(3,4-dialkoxythiophene).

An additional embodiment comprises the composition of embodiment 31, wherein the conjugated polymer is represented by

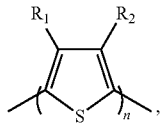

wherein independently $R_1$ is an alkoxy moiety, an optionally substituted alkyl, an optionally substituted aryloxy, optionally substituted alkylene oxide, optionally substituted ethylene oxide or optionally substituted propylene oxide or other lower alkyleneoxy units, can be an optionally substituted alkylene; and
independently $R_2$ is an is an alkoxy moiety, an optionally substituted alkyl, an optionally substituted aryloxy, optionally substituted alkylene oxide, optionally substituted ethylene oxide or optionally substituted propylene oxide or other lower alkyleneoxy units, can be an optionally substituted alkylene.

An additional embodiment comprises the composition of embodiment 31, wherein the conjugated polymer is represented by

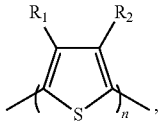

wherein independently $R_1$ is an alkoxyalkoxyalkoxy moiety, and independently $R_2$ is an alkoxyalkoxyalkoxy moiety.

An additional embodiment comprises the composition of embodiment 31, wherein the conjugated polymer is poly(3,4-bis(2-(2-butoxyethoxy)ethoxy)thiophene-2,5-diyl), poly(3,4-bis(2-(2-ethoxyethoxy)ethoxy)thiophene-2,5-diyl), poly(3,4-bis(2-(2-methoxyethoxy)ethoxy)thiophene-2,5-diyl), poly(3,4-bis(2-(2-butoxybutoxy)butoxy)thiophene-2,5-diyl), poly(3,4-bis(2-(2-methoxymethoxy)methoxy)thiophene-2,5-diyl), or combinations thereof.

An additional embodiment comprises the composition of embodiment 31, wherein the photoacid is a diaryl iodonium salt.

An additional embodiment comprises the composition of embodiment 31, wherein the photoacid is a diphenyliodonium salt, and wherein the phenyl rings of the diphenyliodonium salt are optionally substituted.

An additional embodiment comprises the composition of embodiment 31, wherein the photoacid further comprises an anion, wherein the anion is a chloride anion, a bromide anion, an iodide anion, a tetrafluoroborate anion, a hexafluorophosphate anion, an optionally substituted arylsulfonate anion, an optionally substituted alkylsulfonate anion, a perfluoroalkylsulfonate anion, an optionally substituted tetraarylborate anion, an optionally substituted tetraalkylborate anion, or combinations thereof.

An additional embodiment comprises the composition of embodiment 31, wherein the composition further comprises a synthetic polymer different from the conjugated polymer.

An additional embodiment comprises the composition of embodiment 31, wherein the composition further comprises a synthetic polymer different from the conjugated polymer, and the synthetic polymer has a glass transition temperature of greater than 25° C.

An additional embodiment comprises the composition of embodiment 31, wherein the composition further comprises a planarizing agent.

An additional embodiment comprises the composition of embodiment 31, wherein the composition further comprises a planarizing agent, wherein the planarizing agent comprises poly(styrene), poly(styrene) derivatives, poly(vinyl acetate), poly(vinyl acetate) derivatives, poly(ethylene glycol), poly(ethylene glycol) derivatives, poly(ethylene-co-vinyl acetate), poly(pyrrolidone), poly(aryl ether ketones), poly(aryl sulfones), poly(aryl ether sulfones), poly(esters), or combinations thereof.

An additional embodiment comprises the composition of embodiment 31, wherein the composition further comprises a planarizing agent, wherein the planarizing agent comprises a polymer comprising optionally substituted fused aromatic rings or optionally substituted polycyclic aromatic hydrocarbon side groups.

An additional embodiment comprises the composition of embodiment 31, wherein the composition comprises about 25 wt. % to about 99 wt. % conjugated polymer and about 1 wt. % to about 75 wt. % photoacid, wherein wt. % is with respect to the total amount of conjugated polymer and the photoacid.

An additional embodiment comprises the composition of embodiment 31, wherein the amount of photoacid is about 0.01 m/ru to about 1 m/ru, wherein m is the molar amount of the photoacid and ru is the molar amount of conjugated polymer repeat unit.

An additional embodiment comprises the composition of embodiment 31 wherein the conjugated polymer is soluble in tetrahydrofuran, chloroform, alkylated benzenes, halogenated benzenes, NMP, DMF, DMAc, DMSO, methyl ethyl ketone, cyclohexanone, chloroform, dichloromethane, acetone, dioxanes, ethyl acetate, ethyl benzoate, ethylene carbonate, or propylene carbonate.

An additional embodiment comprises the composition of embodiment 31 further comprising an organic solvent.

An additional embodiment comprises the composition of embodiment 31 further comprising an organic solvent, wherein the organic solvent is tetrahydrofuran, chloroform, or an aromatic hydrocarbon.

An additional embodiment comprises the composition of embodiment 31, wherein the composition is formulated for use as a hole injection or hole transport layer in an organic electronic device.

An additional embodiment comprises the composition of embodiment 31, wherein the composition is heated after mixing the conjugated polymer and photoacid.

An additional embodiment comprises the composition of embodiment 31, wherein the anion comprises fluorine, and the composition is substantially free of any additional perfluorinated material.

An additional embodiment comprises the composition of embodiment 31, wherein the composition is a film coated on a substrate, and the film is intractable to an organic solvent.

An additional embodiment comprises the composition of embodiment 31, wherein the composition is a film coated on a substrate, and the film is intractable to toluene.

An additional embodiment comprises the composition of embodiment 31, further comprising a hole-transporting compound, wherein the hole-transporting compound comprises:
a small molecule or a hole-transporting polymer, wherein the hole-transporting polymer comprises repeat units comprising hole-transporting units in the main-chain and/or a side-chain.

An additional embodiment ("embodiment 57") comprises a composition comprising poly(3,4-dialkoxythiophene) and a redox dopant.

An additional embodiment comprises the composition of embodiment 57, wherein the at least one redox dopant is a quinone, a borane, a carbocation, a bora-tetraazapentalene, an aminium or ammonilium salt, a sulfonium salt, an oxonium salt, a selenonoium salt, a nitrosonium salt, an arsonium salt, a phosphonium salt, an iodonium salt, a metal salt, or combinations thereof.

An additional embodiment comprises the composition of embodiment 57 wherein the redox dopant comprises at least one diaryl iodonium salt.

An additional embodiment comprises the composition of embodiment 57 wherein the redox dopant comprises at least one diphenyl iodonium salt, and wherein the phenyl rings of the diphenyliodonium salt are optionally substituted.

An additional embodiment comprises the composition of embodiment 57, wherein the redox dopant is a diphenyliodonium salt, wherein the anion is a chloride anion, a bromide anion, an iodide anion, a tetrafluoroborate anion, a hexafluorophosphate anion, an optionally substituted arylsulfonate anion, an optionally substituted alkylsulfonate anion, a perfluoroalkylsulfonate anion, an optionally substituted tetraarylborate anion, an optionally substituted tetraalkylborate anion, or combinations thereof.

An additional embodiment comprises the composition of embodiment 57 wherein the redox dopant comprises a diphenyl iodonium salt with a molecular weight of about 100 g/mol to about 500 g/mol.

An additional embodiment comprises the composition of embodiment 57 wherein the poly(3,4-dialkoxythiophene) is represented by:

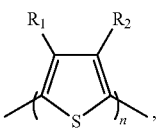

wherein independently $R_1$ is an alkoxyalkoxyalkoxy group and independently $R_2$ is an alkoxyalkoxyalkoxy group, and wherein the poly(3,4-dialkoxythiophene) has a number average molecular weight between approximately 5,000 and 100,000 g/mol.

An additional embodiment comprises the composition of embodiment 57 wherein the poly(3,4-dialkoxythiophene) is poly(3,4-bis(2-(2-butoxyethoxy)ethoxy)thiophene).

An additional embodiment comprises the composition of embodiment 57, wherein the poly(3,4-dialkoxythiophene) and the redox dopant have been mixed in an organic solvent, heated, and the organic solvent removed.

An additional embodiment comprises the composition of embodiment 57, wherein the composition further comprises a synthetic polymer different from the conjugated polymer.

An additional embodiment comprises the composition of embodiment 57, wherein the composition further comprises a planarizing agent.

An additional embodiment comprises the composition of embodiment 57, wherein the composition further comprises a planarizing agent, wherein the planarizing agent comprises poly(styrene), poly(styrene) derivatives, poly(vinyl acetate), poly(vinyl acetate) derivatives, poly(ethylene glycol), poly (ethylene glycol) derivatives, poly(ethylene-co-vinyl acetate), poly(pyrrolidone), poly(aryl ether ketones), poly (aryl sulfones), poly(aryl ether sulfones), poly(esters), or combinations thereof.

An additional embodiment comprises the composition of embodiment 57, wherein the composition further comprises a planarizing agent, wherein the planarizing agent comprises a polymer comprising optionally substituted fused aromatic rings or optionally substituted polycyclic aromatic hydrocarbon side groups.

An additional embodiment comprises the composition of embodiment 57, wherein the composition comprises about 25 wt. % to about 99 wt. % of poly(3,4-dialkoxythiophene) and about 1 wt. % to about 75 wt. % redox dopant, wherein wt. % is with respect to the total amount of conjugated polymer and the redox dopant.

An additional embodiment comprises the composition of embodiment 57, wherein the composition is heated after mixing the poly(3,4-dialkoxythiophene) and the redox dopant.

An additional embodiment comprises the composition of embodiment 57, wherein the composition is a film coated on a substrate, and the film is intractable to toluene.

An additional embodiment comprises the composition of embodiment 57, wherein the poly(3,4-dialkoxythiophene) is poly(3,4-bis(2-(2-butoxyethoxy)ethoxy)thiophene) and the redox dopant is a diaryl iodonium salt comprising a borate anion.

An additional embodiment ("embodiment 74") comprises the composition comprising a mixture of at least one conjugated polymer, at least one redox dopant, and a solvent carrier.

An additional embodiment comprises the composition of embodiment 74, wherein the composition is formulated for use as a hole injection or hole transport layer in an organic electronic device.

An additional embodiment comprises the composition of embodiment 74 wherein the solvent carrier comprises at least one organic solvent, wherein the organic solvent is the primary solvent in the solvent carrier.

An additional embodiment comprises the composition of embodiment 74 wherein the solvent carrier comprises at least one aprotic solvent, wherein the aprotic solvent is the primary solvent in the solvent carrier.

An additional embodiment comprises the composition of embodiment 74, wherein the composition further comprises at least one planarizing agent.

An additional embodiment comprises the composition of embodiment 74, wherein the composition comprises at least 97 wt. % solvent carrier, and the composition is characterized by a percent solids of 3 wt. % or less.

An additional embodiment comprises the composition of embodiment 74, wherein the composition is treated to increase doping as measured by UV-vis-NIR spectra.

An additional embodiment comprises the composition of embodiment 74, wherein the composition is heated.

An additional embodiment comprises the composition of embodiment 74, wherein the composition is heated to a reflux temperature of the solvent carrier.

An additional embodiment comprises the composition of embodiment 74, wherein the composition is aged without heating to increase doping.

An additional embodiment comprises the composition of embodiment 74, wherein the redox dopant is an iodonium salt.

An additional embodiment comprises the composition of embodiment 74, wherein the redox dopant is an optionally substituted diaryl iodonium salt.

An additional embodiment comprises the composition of embodiment 74, wherein the conjugated polymer comprises a polythiophene backbone.

An additional embodiment comprises the composition of embodiment 74 wherein the conjugated polymer is a 3,4-disubstituted polythiophene.

An additional embodiment comprises the composition of embodiment 74, wherein the conjugated polymer is represented by:

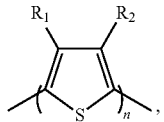

wherein independently $R_1$ is an alkoxy moiety, an optionally substituted alkyl, an optionally substituted aryloxy, an optionally substituted alkylene oxide, an optionally substituted ethylene oxide, or an optionally substituted propylene oxide; and independently $R_2$ is an is an alkoxy moiety, an optionally substituted alkyl, an optionally substituted aryloxy, an optionally substituted alkylene oxide, an optionally substituted ethylene oxide, or an optionally substituted propylene oxide.

An additional embodiment comprises the composition of embodiment 74, wherein the conjugated polymer is represented by

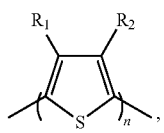

wherein independently $R_1$ is an alkoxyalkoxyalkoxy group and independently $R_2$ is an alkoxyalkoxyalkoxy group, and wherein the conjugated polymer a number average molecular weight between approximately 5,000 and 100,000 g/mol.

An additional embodiment comprises the composition of embodiment 74, wherein the composition is formulated for use as a hole injection or hole transport layer in an organic electronic device, and the solvent carrier comprises at least one organic solvent, wherein the organic solvent is the primary solvent in the solvent carrier, and wherein the composition further comprises at least one planarizing agent, and wherein the composition comprises at least 97 wt. % solvent carrier, and the composition is characterized by a percent solids of 3 wt. % or less.

An additional embodiment ("embodiment 91") comprises a device comprising at least one layer comprising the composition of embodiments 1, 31, 57, or 74.

An additional embodiment comprises the device of embodiment 91 wherein the layer is a hole injection layer or a hole transport layer or hole extraction layer.

An additional embodiment comprises the device of embodiment 91, wherein the device is an organic electronic device.

An additional embodiment comprises the device of embodiment 91, wherein the device is an OLED, a PHOLED, or a photovoltaic device.

An additional embodiment comprises the device of embodiment 91 wherein the composition is a coating on an electrode.

An additional embodiment comprises the device of embodiment 91 wherein the device is a PHOLED device with a lifetime at t50 of at least 1400 hours.

An additional embodiment ("embodiment 97") comprises a method of making a device comprising:
  providing a substrate;
  providing the composition of embodiments 1, 31, 57, or 74;
  providing an active layer;
  providing a cathode; and
  optionally providing a transparent conductor;
  combining the substrate, the composition of embodiments 1, 31, 57, or 74, the active layer, the cathode, and the transparent conductor.

An additional embodiment comprises the method of embodiment 97 wherein the step of combining the substrate, the composition of embodiments 1, 31, 57, or 74, and the active layer, the cathode, and the transparent conductor comprises solution processing.

An additional embodiment comprises the method of embodiment 97 wherein the composition is heated after mixing the conjugated polymer and redox dopant.

An additional embodiment comprises the method of embodiment 97 wherein the redox dopant is an iodonium salt, and the composition is heated after mixing the conjugated polymer and the iodonium salt.

An additional embodiment comprises the method of embodiment 97 wherein the conjugated polymer is 3,4-bis(2-(2-butoxyethoxy)ethoxy)thiophene and the redox dopant is a diaryl iodonium salt comprising a borate anion.

An additional embodiment comprises the method of embodiment 97 wherein the conjugated polymer is a poly(3,4-dialkoxythiophene), and wherein the poly(3,4-dialkoxythiophene) and the redox dopant have been mixed in organic solvent, heated, and organic solvent removed.

An additional embodiment comprises the method of embodiment 97 wherein the composition is aged without heating to increase doping.

An additional embodiment comprises the method of embodiment 97 wherein the composition is heated to a reflux temperature of the solvent carrier.

An additional embodiment comprises the method of embodiment 97 wherein the composition is formulated for use as a hole injection or hole transport layer in an organic electronic device, and the solvent carrier comprises at least one organic solvent, wherein the organic solvent is the primary solvent in the solvent carrier, and wherein the composition further comprises at least one planarizing agent, and wherein the composition comprises at least 97 wt. % solvent carrier, and the composition is characterized by a percent solids of 3 wt. % or less.

An additional embodiment ("embodiment 106") comprises a method comprising: applying the composition of embodiments 1, 31, 57, or 74 as part of an HIL or HTL layer in an OLED, a photovoltaic device, a PHOLED, an ESD, a SMOLED, a PLED, a sensor, a supercapacitor, a hybrid capacitor, a cation transducer, a drug release device, an electrochromic device, a transistor, a field effect transistor, an electrode modifier, an electrode modifier for an organic field transistor, an actuator, or a transparent electrode.

An additional embodiment comprises a composition comprising: at least one iodonium salt mixed with at least one poly(3,4-dialkoxythiophene).

An additional embodiment comprises a composition comprising: at least one poly(3,4-dialkoxythiophene) doped with at least one iodonium salt.

An additional embodiment comprises a composition prepared by combining at least one poly(3,4-dialkoxythiophene) and at least one iodonium salt.

An additional embodiment comprises the composition of embodiment 1 further comprising a non-halogenated solvent.

An additional embodiment comprises the composition of embodiment 1 further comprising an organic solvent selected from ethers, ethylene glycol monoether acetates, propylene glycol monoether acetates, aliphatic ketones, and aromatic ketones, An additional embodiment comprises the composition of embodiment 1 further comprising an organic solvent selected from N,N-dimethyl formamide, N,N-dimethyl acetamide, N-methylpyrrolidone, dimethyl sulfoxide, tetramethylene sulfoxide, acetonitrile, benzonitrile, ethylene carbonate, and propylene carbonate, An additional embodiment comprises the composition of embodiment 31 further comprising a non-halogenated solvent.

An additional embodiment comprises the composition of embodiment 31 further comprising an organic solvent selected from ethers, ethylene glycol monoether acetates, propylene glycol monoether acetates, aliphatic ketones, and aromatic ketones, An additional embodiment comprises the composition of embodiment 31 further comprising an organic solvent selected from N,N-dimethyl formamide, N,N-dimethyl acetamide, N-methylpyrrolidone, dimethyl sulfoxide, tetramethylene sulfoxide, acetonitrile, benzonitrile, ethylene carbonate, and propylene carbonate, An additional embodiment comprises the composition of embodiment 57 further comprising a non-halogenated solvent.

An additional embodiment comprises the composition of embodiment 57 further comprising an organic solvent selected from ethers, ethylene glycol monoether acetates, propylene glycol monoether acetates, aliphatic ketones, and aromatic ketones, An additional embodiment comprises the composition of embodiment 57 further comprising an organic solvent selected from N,N-dimethyl formamide, N,N-dimethyl acetamide, N-methylpyrrolidone, dimethyl sulfoxide, tetramethylene sulfoxide, acetonitrile, benzonitrile, ethylene carbonate, and propylene carbonate, An additional embodiment comprises the composition of embodiment 74, wherein the solvent carrier comprises at least one non-halogenated solvent, wherein the nonhalogenated solvent is the primary solvent in the solvent carrier.

An additional embodiment comprises the composition of embodiment 74, wherein the solvent carrier comprises at least one organic solvent selected from ethers, ethylene glycol monoether acetates, propylene glycol monoether acetates, aliphatic ketones, and aromatic ketones, wherein the organic solvent is the primary solvent in the solvent carrier An additional embodiment comprises the composition of embodiment 74, wherein the solvent carrier comprises at least one organic solvent selected from N,N-dimethyl formamide, N,N-dimethyl acetamide, N-methylpyrrolidone, dimethyl sulfoxide, tetramethylene sulfoxide, acetonitrile, benzonitrile, ethylene carbonate, and propylene carbonate, wherein the organic solvent is the primary solvent in the solvent carrier.

What is claimed is:

1. A composition comprising poly(3,4-di-polyether)-thiophene doped with at least one redox dopant, wherein the two polyether moieties are each an independent substitution and do not form a ring together, and each polyether moiety includes three, four, five, or six oxygen atoms in the moiety, and wherein the composition comprises 25 wt. % to 99 wt. % poly(3,4-di-polyether)-thiophene and 1 wt. % to 75 wt. % redox dopant, wherein wt. % is with respect to the total amount of poly(3,4-di-polyether)-thiophene and the redox dopant, and a non-aqueous solvent.

2. The composition of claim 1, wherein the at least one redox dopant is a quinone, a borane, a carbocation, a bora-tetraazapentalene, an aminium or ammonilium salt, a sulfonium salt, an oxonium salt, a selenonoium salt, a nitrosonium salt, an arsonium salt, a phosphonium salt, an iodonium salt, a metal salt, or combinations thereof.

3. The composition of claim 1, wherein the at least one redox dopant comprises at least one diaryl iodonium salt.

4. The composition of claim 1, wherein the at least one redox dopant comprises at least one diphenyl iodonium salt, and wherein the phenyl rings of the diphenyliodonium salt are optionally substituted.

5. The composition of claim 1, wherein the at least one redox dopant is a diphenyliodonium salt, wherein the anion is a chloride anion, a bromide anion, an iodide anion, a tetrafluoroborate anion, a hexafluorophosphate anion, an optionally substituted arylsulfonate anion, an optionally substituted alkylsulfonate anion, a perfluoroalkylsulfonate anion, an optionally substituted tetraarylborate anion, an optionally substituted tetraalkylborate anion, or combinations thereof.

6. The composition of claim 1 wherein the at least one redox dopant comprises a diphenyl iodonium salt with a molecular weight of about 100 g/mol to about 500 g/mol.

7. The composition of claim 1 wherein the poly(3,4-di-polyether)-thiophene is represented by:

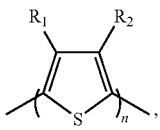

wherein independently R₁ is an alkoxyalkoxyalkoxy group and independently R₂ is an alkoxyalkoxyalkoxy group, and wherein the poly(3,4-di-polyether)-thiophene has a number average molecular weight between approximately 5,000 and 100,000 g/mol.

8. The composition of claim 1 wherein the poly(3,4-di-polyether)-thiophene is poly(3,4-bis(2-(2-butoxyethoxy)ethoxy)thiophene).

9. The composition of claim 1, wherein the poly(3,4-di-polyether)-thiophene and the at least one redox dopant have been mixed in an organic solvent, heated, and the organic solvent removed.

10. The composition of claim 1 wherein the poly(3,4-di-polyether)-thiophene is poly(3,4-bis(2-(2-butoxyethoxy)ethoxy)thiophene) and the at least one redox dopant is a diaryl iodonium salt comprising a borate anion.

11. A device comprising at least one layer prepared with the composition of claim 1.

12. The device of claim 11, wherein the device is an OLED or a PHOLED device.

13. The device of claim 11 wherein the composition is a coating on an electrode.

14. The device of claim 11, wherein the device is a PHOLED device with a lifetime at t50 of at least 1400 hours.

15. A method of making a device comprising:
providing a substrate;
providing the composition of claim 1;
providing an active layer;
providing a cathode; and
optionally providing a transparent conductor;
combining the substrate, the composition of claim 1, the active layer, the cathode, and the transparent conductor.

16. A method comprising: applying the composition of claim 1 as part of an HIL layer in an OLED.

17. The composition of claim 1 wherein the non-aqueous solvent is a non-halogenated solvent.

18. The composition of claim 1 wherein the non-aqueous solvent is selected from ethers, ethylene glycol monoether acetates, propylene glycol monoether acetates, aliphatic ketones, and aromatic ketones.

19. The composition of claim 1 wherein the non-aqueous solvent is selected from N,N-dimethyl formamide, N,N-dimethyl acetamide, N-methyl pyrrolidone, dimethyl sulfoxide, tetramethylene sulfoxide, acetonitrile, benzonitrile, ethylene carbonate, and propylene carbonate.

20. The composition of claim 1, wherein the redox dopant comprises an optionally substituted tetraarylborate anion.

21. The composition of claim 1, wherein the redox dopant comprises an tetrakis(pentafluorophenyl)borate anion.

22. The composition of claim 1, wherein each polyether moiety includes three oxygen atoms in the moiety.

23. The composition of claim 1, wherein each polyether moiety is an alkoxyalkoxyalkoxy moiety.

24. The composition of claim 1, wherein each polyether moiety is a straight chain polyether.

25. The composition of claim 1, wherein the poly(3,4-di-polyether)-thiophene is a homopolymer or copolymer.

26. The composition of claim 1, wherein the poly(3,4-di-polyether)-thiophene is soluble in chloroform.

27. The composition of claim 1, wherein the poly(3,4-di-polyether)-thiophene has a symmetrical monomer repeating unit.

28. The composition of claim 1, wherein the polyether substituents include a chain terminal group which is at least as long as butyl.

29. The composition of claim 1, wherein the composition comprises a solvent carrier, and the solvent carrier comprises at least one organic solvent, wherein the organic solvent is the primary solvent in the solvent carrier.

30. The composition of claim 1 wherein the non-aqueous solvent is selected from ethyl benzoate, ethylene carbonate, and propylene carbonate.

31. The composition of claim 1, which is formulated for use as a non-aqueous hole injection layer in an OLED device and wherein the OLED is a phosphorescent OLED.

32. The composition of claim 1, wherein the composition is heated after mixing the poly(3,4-di-polyether)-thiophene, redox dopant and the non-aqueous solvent.

33. The composition of claim 1, wherein the dopant comprises an anion which comprises fluorine, and the composition is substantially free of any additional perfluorinated material.

34. The composition of claim 1, wherein the composition is a film coated on a substrate, and the film is intractable to toluene.

35. The composition of claim 1, wherein the composition further comprises a synthetic polymer different from the poly (3,4-di-polyether)-thiophene.

36. The composition of claim 1, wherein the composition further comprises a synthetic polymer different from the poly (3,4-di-polyether)-thiophene, wherein the synthetic polymer comprises a carbon backbone.

37. The composition of claim 1, wherein the composition further comprises a synthetic polymer different from the poly (3,4-di-polyether)-thiophene, wherein the synthetic polymer has a glass transition temperature greater than 25° C.

* * * * *